(12) United States Patent
Han et al.

(10) Patent No.: US 12,364,127 B2
(45) Date of Patent: Jul. 15, 2025

(54) LIGHT-EMITTING SUBSTRATE AND DISPLAY APPARATUS

(71) Applicant: BOE TECHNOLOGY GROUP CO., LTD., Beijing (CN)

(72) Inventors: Ying Han, Beijing (CN); Yicheng Lin, Beijing (CN); Guang Yan, Beijing (CN); Pan Xu, Beijing (CN); Mingi Chu, Beijing (CN); Dongfang Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/790,193

(22) PCT Filed: May 31, 2021

(86) PCT No.: PCT/CN2021/097509
§ 371 (c)(1),
(2) Date: Jun. 30, 2022

(87) PCT Pub. No.: WO2022/252090
PCT Pub. Date: Dec. 8, 2022

(65) Prior Publication Data
US 2024/0188350 A1 Jun. 6, 2024

(51) Int. Cl.
H10K 59/13 (2023.01)
H10K 59/123 (2023.01)
(Continued)

(52) U.S. Cl.
CPC ....... *H10K 59/1315* (2023.02); *H10K 59/123* (2023.02); *H10K 59/13* (2023.02);
(Continued)

(58) Field of Classification Search
CPC .............. H10K 59/60; H10K 59/1315; H10K 59/8052; H10K 59/123; H10K 59/13;
(Continued)

(56) References Cited

U.S. PATENT DOCUMENTS

| 2005/0012454 A1 | 1/2005 | Yamazaki et al. |
| 2008/0158108 A1 | 7/2008 | Hwang et al. |

(Continued)

FOREIGN PATENT DOCUMENTS

| CN | 107316884 A | 11/2017 |
| CN | 107749419 A | 3/2018 |

(Continued)

OTHER PUBLICATIONS

PCT International Search Report (w/ English translation) and Written Opinion for corresponding PCT Application No. PCT/CN2021/097509, mailed Jan. 30, 2022, 11 pages.

(Continued)

*Primary Examiner* — Steven B Gauthier
*Assistant Examiner* — Adam D Weiland
(74) *Attorney, Agent, or Firm* — Dority & Manning, P.A.

(57) ABSTRACT

A light-emitting substrate includes a base substrate, an auxiliary electrode line, at least one light-emitting device, and at least one light-detecting device. The auxiliary electrode line is disposed on the base substrate. The at least one light-emitting device is disposed above the base substrate, and a light-emitting device includes a first electrode, a light-emitting functional layer and a second electrode that are sequentially stacked in a direction moving away from the base substrate. The at least one light-detecting device is disposed above the base substrate, and a light-detecting device includes a third electrode and a fourth electrode. The auxiliary electrode line is coupled to the fourth electrode and the second electrode.

20 Claims, 29 Drawing Sheets

(51) Int. Cl.
*H10K 59/131* (2023.01)
*H10K 59/80* (2023.01)
*H10K 77/10* (2023.01)

(52) U.S. Cl.
CPC ..... *H10K 59/131* (2023.02); *H10K 59/80516* (2023.02); *H10K 59/80522* (2023.02); *H10K 77/10* (2023.02)

(58) Field of Classification Search
CPC ........... H10K 59/131; H10K 59/80516; H10K 59/80522; H10K 77/10; H10K 39/34; H10K 59/65; H10F 19/00–908; H10F 39/10–813; H10H 29/10–142; H10H 29/30–962
See application file for complete search history.

(56) References Cited

U.S. PATENT DOCUMENTS

| | | | |
|---|---|---|---|
| 2012/0115260 A1 | 5/2012 | Hwang et al. | |
| 2014/0299879 A1 | 10/2014 | Yamazaki | |
| 2015/0069356 A1 | 3/2015 | Lee et al. | |
| 2015/0351168 A1* | 12/2015 | Yasumoto | B32B 27/281 428/448 |
| 2015/0380476 A1* | 12/2015 | Zhang | H10D 86/40 257/40 |
| 2016/0086546 A1 | 3/2016 | Noh et al. | |
| 2016/0155782 A1* | 6/2016 | Sato | H10K 59/122 257/82 |
| 2018/0006106 A1* | 1/2018 | Oh | H10K 50/828 |
| 2018/0190935 A1 | 7/2018 | Kim et al. | |
| 2019/0197284 A1 | 6/2019 | Park | |
| 2019/0272407 A1 | 9/2019 | Park et al. | |
| 2020/0052241 A1* | 2/2020 | Li | H10K 50/828 |
| 2020/0098839 A1 | 3/2020 | Xu et al. | |
| 2020/0321417 A1 | 10/2020 | Cheng et al. | |
| 2021/0167143 A1 | 6/2021 | He et al. | |
| 2021/0296411 A1 | 9/2021 | Gao et al. | |
| 2022/0037616 A1 | 2/2022 | Liu et al. | |
| 2022/0093894 A1 | 3/2022 | Song et al. | |
| 2022/0336566 A1 | 10/2022 | Chen et al. | |
| 2023/0389359 A1* | 11/2023 | Kinjo | H10K 59/131 |

FOREIGN PATENT DOCUMENTS

| | | |
|---|---|---|
| CN | 110047906 A | 7/2019 |
| CN | 110429114 A | 11/2019 |
| CN | 210200763 U | 3/2020 |
| CN | 112331801 A | 2/2021 |

OTHER PUBLICATIONS

PCT International Search Report and Written Opinion (with English translation) for corresponding PCT Application No. PCT/CN2021/097496, mailed Jan. 13, 2022, 14 pages.

* cited by examiner

S270

S280

LIGHT-EMITTING SUBSTRATE AND DISPLAY APPARATUS

CROSS-REFERENCE TO RELATED APPLICATION

The present application is a national phase entry under 35 USC 371 of International Patent Application No. PCT/CN 2021/097509, filed on May 31, 2021, which is incorporated herein by reference in its entirety.

TECHNICAL FIELD

The present disclosure relates to the field of display technologies, and in particular, to a light-emitting substrate and a display apparatus.

BACKGROUND

Display apparatuses may be classified into various types according to different display principles. For example, an organic light-emitting diode (OLED) display apparatus may include a plurality of OLED devices including an organic light-emitting material. The organic light-emitting material can emit light under driving of an electrical signal. Light-emitting brightness of each OLED device may be changed by adjusting an electrical signal for driving the OLED device, so that the OLED display apparatus may display an image. OLED display apparatuses have a broad development prospect due to their advantages of self-luminescence, high contrast, low energy consumption, wide viewing angle, fast response speed, wide temperature range, ease of manufacturing, and the like.

SUMMARY

In an aspect, a light-emitting substrate is provided. The light-emitting substrate includes a base substrate, an auxiliary electrode line, at least one light-emitting device and at least one light-detecting device. The auxiliary electrode line is disposed on the base substrate. The at least one light-emitting device is disposed above the base substrate. A light-emitting device includes a first electrode, a light-emitting functional layer and a second electrode that are sequentially stacked in a direction moving away from the base substrate. The at least one light-detecting device is disposed above the base substrate. A light-detecting device includes a third electrode and a fourth electrode. The auxiliary electrode line is coupled to the fourth electrode and the second electrode.

In some embodiments, the fourth electrode of the light-detecting device is disposed on a side of the second electrode of the light-emitting device proximate to the base substrate, and the auxiliary electrode line is disposed on a side of the fourth electrode of the light-detecting device proximate to the base substrate. The light-emitting substrate further includes a first connection portion. The first connection portion is disposed on a side of the auxiliary electrode line away from the base substrate and a side of the second electrode proximate to the base substrate, and the first connection portion is coupled to the second electrode, the fourth electrode, and the auxiliary electrode line.

In some embodiments, the light-emitting substrate further includes a first insulating layer disposed on a side of the first connection portion away from the base substrate and a side of the second electrode of the light-emitting device proximate to the base substrate. The first insulating layer includes a first opening, and the first opening exposes at least a portion of the first connection portion. The second electrode of the light-emitting device extends into the first opening, and is in contact with the first connection portion in the first opening.

In some embodiments, the first insulating layer further includes a second opening, and a portion of the light-emitting functional layer of the light-emitting device located in the second opening is in contact with the first electrode of the light-emitting device.

In some embodiments, the first connection portion includes a first connection pattern, a second connection pattern and a third connection pattern that are sequentially stacked in the direction moving away from the base substrate, and an orthogonal projection of the second connection pattern on the base substrate is within an orthogonal projection of the third connection pattern on the base substrate. The first opening of the first insulating layer exposes at least a portion of the first connection pattern, at least a portion of the second connection pattern and at least a portion of the third connection pattern; the light-emitting functional layer of the light-emitting device extends into the first opening, and a portion of the light-emitting functional layer located in the first opening is discontinuous; a portion of the second electrode located in the first opening is in contact with at least one of the first connection pattern, the second connection pattern and the third connection pattern.

In some embodiments, the orthogonal projection of the second connection pattern on the base substrate is within an orthogonal projection of the first connection pattern on the base substrate. The portion of the second electrode located in the first opening is at least in contact with the first connection pattern.

In some embodiments, the light-emitting substrate further includes a second connection portion disposed on a side of the first connection portion proximate to the base substrate and the side of the auxiliary electrode line away from the base substrate. The second connection portion is in contact with the first connection portion and the auxiliary electrode line.

In some embodiments, the light-emitting substrate further includes a second insulating layer and a third insulating layer that are sequentially stacked on the base substrate in the direction moving away from the base substrate, and located on the side of the first connection portion proximate to the base substrate and a side of the second connection portion away from the base substrate. The second insulating layer has a third opening, and the third insulating layer has a fourth opening; an orthogonal projection of an upper edge of the third opening on the base substrate is within an orthogonal projection of a lower edge of the fourth opening on the base substrate, and overlaps with an orthogonal projection of the second connection portion on the base substrate; the first connection portion is in contact with the second connection portion through the third opening and the fourth opening. The upper edge of the third opening is an edge of the third opening away from the base substrate, and the lower edge of the fourth opening is an edge of the fourth opening proximate to the base substrate.

In some embodiments, the second connection portion and the third electrode of the light-emitting device are disposed in a same layer.

In some embodiments, the first connection pattern of the first connection portion is in contact with the fourth electrode.

In some embodiments, the light-emitting substrate further includes a second insulating layer and a third insulating layer that are sequentially stacked above the base substrate in the direction moving away from the base substrate, and located on a side of the first connection portion proximate to the base substrate and a side of the fourth electrode away from the base substrate. The second insulating layer has a fifth opening, and the third insulating layer has a sixth opening. An orthogonal projection of an upper edge of the fifth opening on the base substrate is within an orthogonal projection of a lower edge of the sixth opening on the base substrate, and overlaps with an orthogonal projection of the fourth electrode on the base substrate. The first connection portion is in contact with the fourth electrode through the fifth opening and the sixth opening. The upper edge of the fifth opening is an edge of the fifth opening away from the base substrate, and the lower edge of the sixth opening is an edge of the sixth opening proximate to the base substrate.

In some embodiments, the light-emitting substrate further includes a plurality of transistors. The plurality of transistors include at least one first transistor coupled to the light-emitting device, and a second transistor coupled to the light-detecting device. The plurality of transistors are disposed on the base substrate, and each transistor includes an active layer located on a side of the light-detecting device proximate to the base substrate. The light-detecting device further includes a semiconductor pattern, and an orthogonal projection of the semiconductor pattern on the base substrate is non-overlap with an orthogonal projection of each active layer of the plurality of transistors on the base substrate.

In some embodiments, an area of the orthogonal projection of the semiconductor pattern of the light-detecting device on the base substrate is larger than an area of the orthogonal projection of the active layer of the second transistor on the base substrate.

In some embodiments, the at least one first transistor includes a driving transistor, and a width-to-length ratio of a channel region of the second transistor is less than a width-to-length ratio of a channel region of the driving transistor.

In some embodiments, the light-emitting substrate includes at least two light-detecting devices and at least two second transistors coupled to the at least two light-detecting devices in a one-to-one correspondence. Each second transistor in the at least two second transistors further includes a first conductive portion and a second conductive portion that are respectively located on two sides of the active layer and in contact with the active layer, first conductive portions of the at least two second transistors are an integral pattern, and each second conductive portion is coupled to a light-detecting device of the at least two light-detecting devices.

In some embodiments, the at least two second transistors include four second transistors, the at least two light-detecting devices includes four light-detecting devices. First conductive portions, active layers and second conductive portions of the four second transistors provide a cross pattern.

In some embodiments, the light-emitting substrate further includes a photoelectric detection signal line coupled to the integral pattern.

In some embodiments, the light-emitting substrate further includes at least one conductive ring, each conductive ring is located on a side of the active layer away from the base substrate. A portion of a conductive ring opposite to the active layer of each second transistor of the at least two second transistors serves as a gate of the second transistor; an orthogonal projection of the integral pattern on the base substrate is located inside an orthogonal projection of the conductive ring on the base substrate.

In some embodiments, the light-emitting substrate further includes a photoelectric detection control line including two control line segments coupled to the conductive ring, and each control line segment and the conductive ring provide an obtuse angle at a position where the control line segment coupled to the conductive ring.

In some embodiments, the light-emitting substrate further includes data lines disposed above the base substrate. The data lines and the third electrode are disposed in a same layer.

In some embodiments, the light-emitting substrate further includes gate lines disposed above the base substrate. The gate lines and the auxiliary electrode line are disposed in a same layer.

In some embodiments, the first electrode of the light-emitting device includes a first sub-electrode, a second sub-electrode, and a third sub-electrode that are sequentially stacked in the direction moving away from the base substrate. The first sub-electrode is a transparent conductive electrode, and the second sub-electrode is a reflective electrode; the first sub-electrode includes a first portion and a second portion except for the first portion, the first portion is covered by the third electrode, and an orthogonal projection of the second portion on the base substrate overlaps with an orthogonal projection of the light-detecting device on the base substrate.

In some embodiments, the light-emitting substrate further includes a first connection portion disposed on a side of the auxiliary electrode line away from the base substrate and a side of the second electrode proximate to the base substrate; the first connection portion is coupled to the second electrode, the fourth electrode, and the auxiliary electrode line, and includes a first connection pattern, a second connection pattern, and a third connection pattern that are sequentially stacked in a direction moving away from the base substrate. The first sub-electrode and the first connection pattern of the first connection portion are disposed in a same layer; the second sub-electrode and the second connection pattern of the first connection portion are disposed in a same layer; the third sub-electrode and the third connection pattern of the first connection portion are disposed in a same layer.

In some embodiments, the fourth electrode of the light-detecting device is closer to the light-emitting device than the third electrode. The fourth electrode is a transparent conductive electrode.

In some embodiments, the light-emitting substrate is a display panel.

In another aspect, a display apparatus is provided. The display apparatus includes the light-emitting substrate according to any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal to which the embodiments of the present disclosure relate.

DETAILED DESCRIPTION

Figure 1:
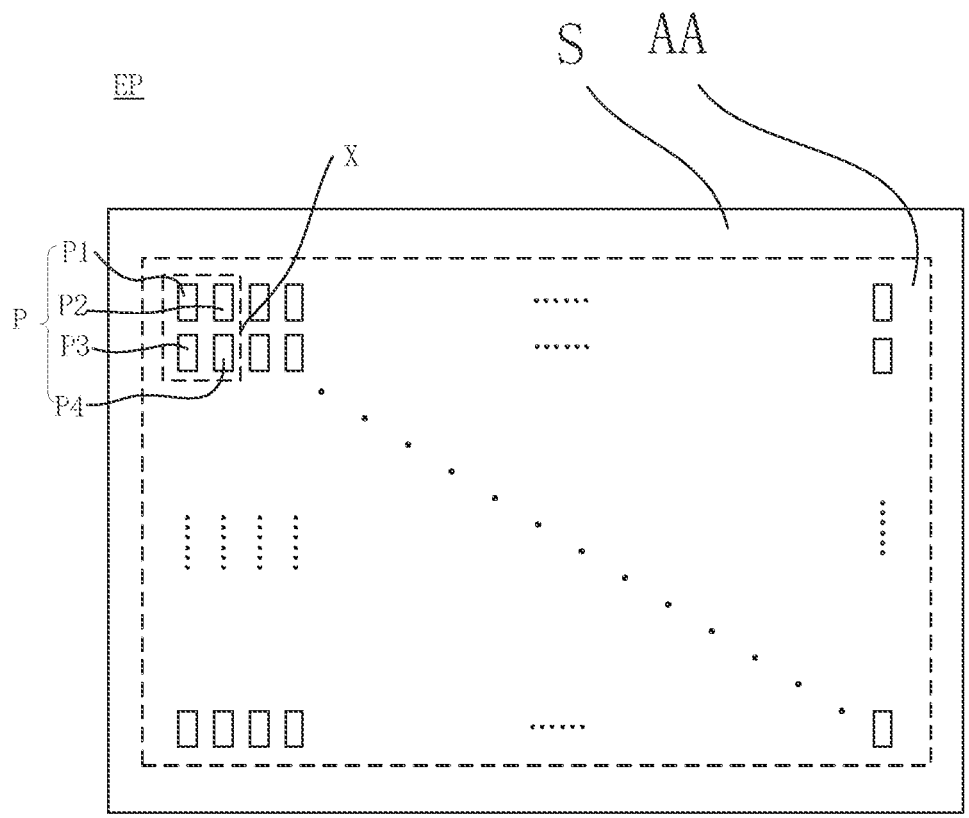
FIG. 1 is a top view of a light-emitting substrate, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representation of the above terms do not necessarily refer to the same embodiment(s) or examples(s). In addition, the specific features, structures, materials or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms "coupled", "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining" or "in response to detecting", depending on the context. Similarly, depending on the context, the phrase "if it is determined . . . " or "if [a stated condition or event] is detected" is optionally construed as "in a case where it is determined . . . ", "in response to determining . . . ", "in a case where [the stated condition or event] is detected" or "in response to detecting [the stated condition or event]".

The use of the phrase "applicable to" or "configured to" herein means an open and inclusive language, which does not exclude devices that are applicable to or configured to perform additional tasks or steps.

In addition, the use of the phrase "based on" or "according to" is meant to be open and inclusive, since a process, step, calculation or other action that is "based on" or "according to" one or more of the stated conditions or values may, in practice, be based on additional conditions or values exceeding those stated.

As used herein, the term such as "about", "substantially" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and regions are enlarged for clarity. Therefore, variations in shapes with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a curved feature. Therefore, the regions shown in the accompanying drawings are schematic in nature, and their shapes are not intended to show actual shapes of regions in a device, and are not intended to limit the scope of the exemplary embodiments.

Some embodiments of the present disclosure provide a display apparatus. The display apparatus is a product with an image display function. For example, the display apparatus may be a display, a television, a billboard, a digital photo frame, a laser printer with a display function, a telephone, a mobile phone, a personal digital assistant (PDA), a digital camera, a camcorder, a viewfinder, a navigator, a vehicle, a large-area wall, a home appliance, an information search device (e.g., a business search device in a department such as an electronic government, a bank, a hospital or an electric power department), a monitor, or the like.

The display apparatus may include a light-emitting substrate, and may further include a control circuit coupled to the light-emitting substrate, and the like. The control circuit is configured to drive the light-emitting substrate to emit light, and includes, for example, a circuit board and an integrated circuit (IC).

In some embodiments, the light-emitting substrate may be a display panel configured to display an image, which may be referred to as the light-emitting substrate since the display panel is required to emit light in a process of displaying the image. For example, the display panel may emit light of three primary colors (e.g., including red, green and blue). The display panel may display a color image by adjusting brightness of the light of the three primary colors. For another example, the display panel may emit light of three primary colors and white light. The display panel may display a color image by adjusting brightness of the light of the three primary colors and the white light. For yet another example, the display panel may only emit white light. The display panel may display a grayscale image by adjusting brightness of the white light. In this case, the display apparatus may further include a color filter disposed on a light exit side of the display panel to convert the white light into light of three primary colors, thereby realizing display of a color image.

For example, the display panel may be an organic light-emitting diode (OLED) display panel, a quantum dot light-emitting diode (QLED) display panel, or a tiny light-emitting diode (LED, which includes mini LED or micro LED) display panel.

In some other embodiments, the light-emitting substrate may be configured to be used as a light source. For example, the display apparatus is a liquid crystal display apparatus. The liquid crystal display apparatus includes a liquid crystal display panel and a light-emitting substrate disposed on a back surface of the display panel (i.e., a surface facing away from a display surface of the display panel). The light-emitting substrate may serve as a backlight source for providing backlight for the liquid crystal display panel.

Some embodiments of the present disclosure provide a light-emitting substrate. The light-emitting substrate may be applied to the display apparatus, or may be applied to a lighting device such as a lamp. The embodiments are described by taking an example in which the light-emitting substrate is a display panel.

FIG. 1 is a top view of the light-emitting substrate. As shown in FIG. 1, the light-emitting substrate EP includes at least one sub-pixel unit (e.g., one or more sub-pixel units) P. For example, the light-emitting substrate EP has a display area AA and a peripheral area S located on at least one side of the display area AA. A plurality of sub-pixel units P are disposed in the display area AA. The plurality of sub-pixel units P may include sub-pixel units that are of different light-emitting colors. For example, the plurality of sub-pixel units P include a sub-pixel unit P1, a sub-pixel unit P2, a sub-pixel unit P3, and a sub-pixel unit P4 that are of different light-emitting colors; the four sub-pixel units may respectively emit red light, green light, blue light, and white light. For example, the sub-pixel unit P1 may emit red light, the sub-pixel unit P2 may emit green light, the sub-pixel unit P3 may emit blue light, and the sub-pixel unit P4 may emit white light. For another example, the plurality of sub-pixel units P may include three sub-pixel units that are of different light-emitting colors; the three sub-pixel units may respectively emit red light, green light, and blue light.

Figure 2:
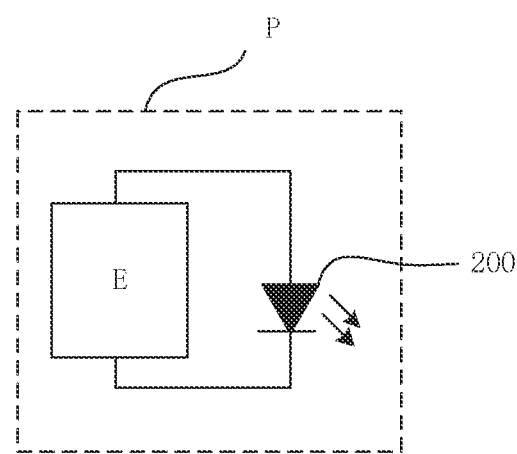
FIG. 2 is a structural diagram of a sub-pixel unit in a light-emitting substrate, in accordance with some embodiments.

FIG. 2 shows a structure of the sub-pixel unit. Referring to FIG. 2, the sub-pixel unit P includes a light-emitting device 200 and a pixel driving circuit E that provides a driving current or a driving voltage for the light-emitting device 200.

The light-emitting device 200 may be an electroluminescent device, such as an organic electroluminescent device (e.g., OLED), or an inorganic light-emitting device (e.g., LED or tiny LED). Alternatively, the light-emitting device 200 may be a QLED.

Figure 3:
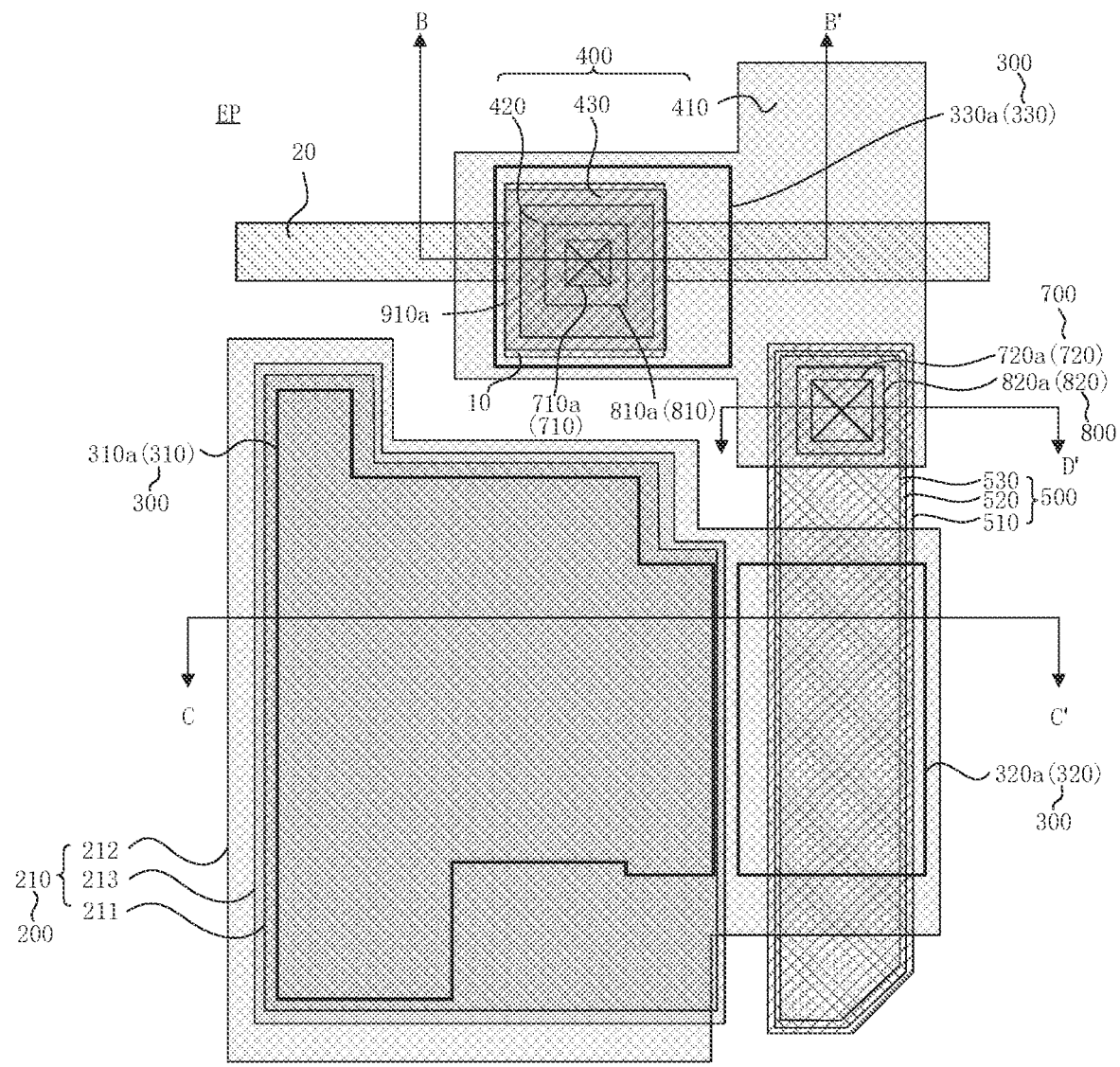
FIG. 3 is a partial top view of a light-emitting substrate, in accordance with some embodiments.

FIG. 3 is a partial top view of the light-emitting substrate. It will be noted that, FIG. 3 only shows a plurality of layers for forming the light-emitting device 200 and a light-detecting device 500 in the light-emitting substrate EP, and omits some other layers in the light-emitting substrate EP.

Figure 4A:
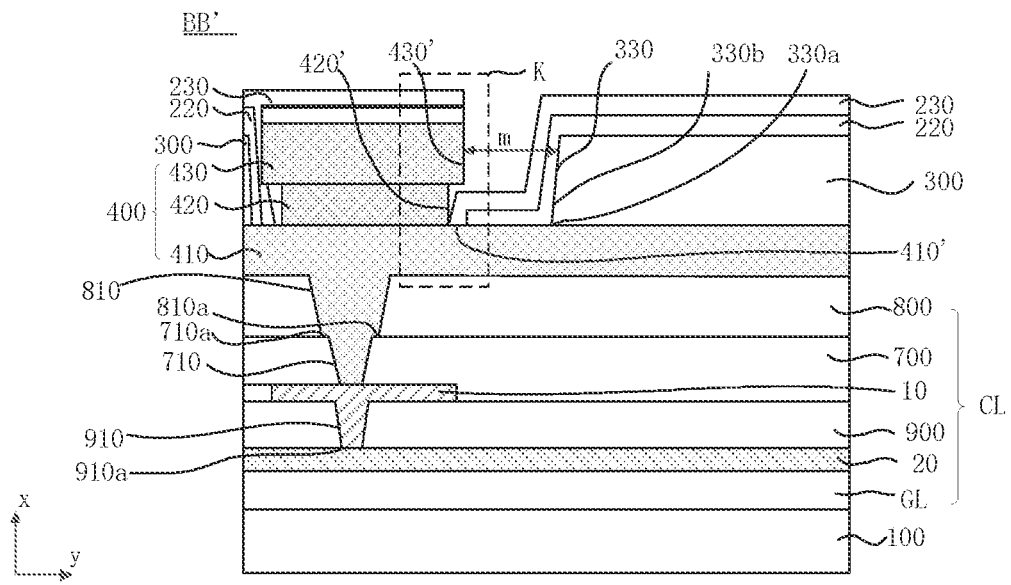
FIG. 4A is a sectional view of the light-emitting substrate in FIG. 3 taken along the line BB', in accordance with some embodiments.

FIG. 4A is a sectional view of the light-emitting substrate taken along the section line BB' in FIG. 3.

Referring to FIG. 3, the light-emitting substrate EP includes a base substrate, a light-emitting device 200, a light-detecting device 500, and an auxiliary electrode line 20.

Figure 4B:
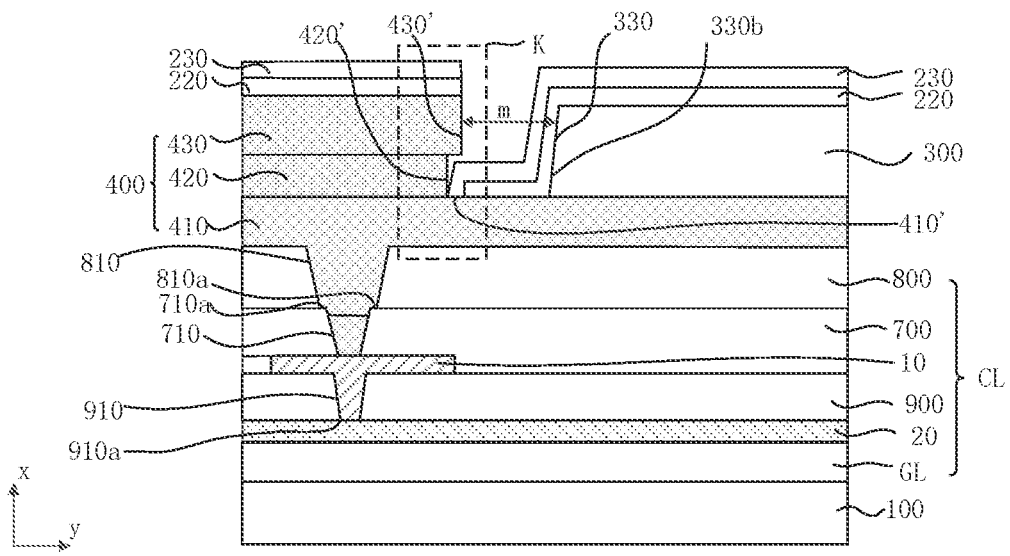
FIG. 4B is a sectional view of another light-emitting substrate, in accordance with some embodiments.

Referring to FIGS. 4A and 4B, the light-emitting device 200 may be disposed above the base substrate 100. The light-emitting device 200 includes a first electrode 210, a light-emitting functional layer 220 and a second electrode 230 that are sequentially stacked in a direction moving away from the base substrate 100 (e.g., parallel to the x direction). For example, the first electrode 210 is closer to the base substrate 100 than the second electrode 230, and the light-emitting functional layer 230 is located between the first electrode 210 and the second electrode 230 in a thickness direction of the light-emitting device 200 (e.g., parallel to the x direction). One of the first electrode 210 and the second electrode 230 is a cathode, and the other is an anode.

The light-emitting functional layer 230 may have a single-layer structure or a multi-layer structure. For example, the light-emitting functional layer 220 may include a light-emitting layer. The light-emitting functional layer 220 may further include at least one of a hole injection layer, a hole transport layer, and an electron blocking layer that are located between the anode and the light-emitting layer; alternatively, the light-emitting functional layer 220 may further include at least one of a hole blocking layer, an electron transport layer, and an electron injection layer that are located between the light-emitting layer and the cathode. The light-emitting layer in the light-emitting device may be a red light-emitting layer, a green light-emitting layer, a blue light-emitting layer or a white light-emitting layer.

In some embodiments, the second electrode 230 may be the cathode. In a case where the light-emitting device 200 is a top emission light-emitting device, the second electrode 230 may be transparent or translucent, so as to allow light emitted by the light-emitting functional layer 220 to exit through the second electrode 230. A material of the second electrode 230 may be metal oxide, such as indium tin oxide (ITO), or indium zinc oxide (IZO). Alternatively, the material of the second electrode 230 may be metal, such as alloy. In this case, the first electrode 210 may be the anode.

In some other embodiments, the first electrode 210 may be the cathode, and the second electrode 230 may be the anode.

Sheet resistance of the second electrode 230 in the light-emitting device 200 may be relatively large. In an example in which the light-emitting substrate is the top emission OLED display panel, the second electrode 230 may be a transparent cathode, and the material thereof may be metal oxide, such as indium tin oxide (ITO), or indium zinc oxide (IZO). In a case where the light-emitting substrate includes a plurality of light-emitting devices 200, cathodes of the light-emitting devices 200 may be in contact with one another to form a whole electrode layer. However, resistance of the transparent cathode electrode layer is relatively large due to properties of the material itself, and there is a problem of voltage drop (IR drop) on a large-sized OLED display panel, which affects light-emitting effect and/or display effect of the OLED display panel.

In order to solve the problem, the light-emitting substrate may include at least one auxiliary electrode line 20. The auxiliary electrode line 20 may be disposed on the base substrate 100. For example, referring to FIGS. 4A and 4B, the auxiliary electrode line 20 may be disposed on a side of the second electrode 230 of the light-emitting device proximate to the base substrate 100. The auxiliary electrode line 20 may be coupled to the second electrode 230 of the light-emitting device. For example, each auxiliary electrode line is coupled to second electrodes of at least two light-emitting devices (e.g., an electrode layer forming the second electrodes of the light-emitting devices). In this case, at least a portion of the auxiliary electrode line is connected to the electrode layer in parallel. Compared with a second electrode that is not coupled to the auxiliary electrode line, the sheet resistance of the second electrode coupled to the auxiliary electrode line may be reduced, so that better light-emitting effect and/or display effect may be obtained.

A manner in which the auxiliary electrode line is coupled to the second electrode of the light-emitting device will be described below.

As shown in FIGS. 3, 4A and 4B, the light-emitting substrate EP provided by the embodiments of the present disclosure further includes a first connection portion 400. The first connection portion 400 may be disposed above the base substrate 100. For example, the first connection portion 400 may be disposed on a side of the auxiliary electrode line 20 away from the base substrate 100 and the side of the second electrode 230 of the light-emitting device proximate to the base substrate 100. For example, in the thickness direction of the light-emitting substrate EP (e.g., parallel to the x direction), the first connection portion 400 is disposed between the second electrode 230 and the auxiliary electrode line 20.

A relative position of the light-emitting device and the first connection portion 400 may be as shown in FIG. 3 (a position of the light-emitting device may be the same as a position of the first electrode 210 of the light-emitting device). In the light-emitting substrate EP, second electrodes 230 of a plurality of light-emitting devices may be disposed in a same layer. For example, in a manufacturing process of the light-emitting substrate EP, the second electrodes 230 of the plurality of light-emitting devices may be formed as a whole layer through a sputtering process. In this case, the second electrode 230 of the light-emitting device may extend to a position where the first connection portion 400 is located.

In some possible implementations, as shown in FIGS. 3, 4A and 4B, the light-emitting substrate EP further includes a first insulating layer 300. The first insulating layer 300 may be disposed above the base substrate. For example, the first insulating layer 300 may be disposed on a side of the first connection portion 400 away from the base substrate 100, and the first insulating layer 300 may also be disposed on the side of the second electrode 230 of the light-emitting device proximate to the base substrate 100. That is, in the thickness direction of the light-emitting substrate EP (e.g., parallel to the x direction), the first insulating layer 300 may be located between the first connection portion 400 and the second electrode 230 of the light-emitting device.

The first insulating layer 300 includes a first opening 330. The first opening 330 may expose at least a portion of the first connection portion 400, and the second electrode 230 of the light-emitting device may extend into the first opening 330, that is, the second electrode 230 of the light-emitting device may extend to the position where the first connection portion 400 is located. In this case, the first connection portion 400 may be in contact with the second electrode 230 in the first opening 330. Further, the first connection portion 400 may further be coupled to the auxiliary electrode line 20, so that the second electrode 230 may be coupled to the auxiliary electrode line 20 through the first connection portion 400.

A manner in which the first connection portion 400 is coupled to the second electrode 230 will be described below.

As shown in FIGS. 4A and 4B, the first connection portion 400 includes a first connection pattern 410, a second connection pattern 420 and a third connection pattern 430 that are sequentially stacked in the direction moving away from the base substrate 100 (e.g., the x direction). For example, among the first connection pattern 410, the second connection pattern 420, and the third connection pattern 430, the first connection pattern 410 is closest to the base substrate 100, the third connection pattern 430 is farthest away from the base substrate 100, and the second connection pattern 420 is located between the first connection pattern 410 and the third connection pattern 430 in the thickness direction of the light-emitting substrate EP (e.g., parallel to the x direction).

An orthogonal projection of the second connection pattern 420 on the base substrate 100 is within an orthogonal projection of the third connection pattern 430 on the base substrate 100. In this case, a positional relationship the two orthogonal projections may be one of the following two cases.

In a first case, referring to FIG. 4A, there is an annular gap between a border of the orthogonal projection of the second connection pattern 420 on the base substrate 100 and a border of the orthogonal projection of the third connection pattern 430 on the base substrate 100, so that a structure that a whole edge of the second connection pattern 420 is indented inward compared to the third connection pattern 430 in FIG. 3 is formed. In this case, in the first connection portion 400, in an extending direction of the patterns (e.g., parallel to the y direction), the whole edge of the second connection pattern 420 may be indented inward compared to an edge of the third connection pattern 430. That is, the whole edge of the third connection pattern 430 may protrude from the second connection pattern 420.

In a second case, referring to FIG. 4B, a portion of the border of the orthogonal projection of the second connection pattern 420 on the base substrate 100 coincides with a portion of the edge of the orthogonal projection of the third connection pattern 430 on the base substrate 100, and another portion of the border of the orthogonal projection of the second connection pattern 420 on the base substrate 100 is indented inward compared to another portion of the border of the orthogonal projection of the third connection pattern 430 on the base substrate 100. In this case, in the first connection portion 400, a portion of the edge of the second connection pattern 420 may be indented inward compared to the edge of the third connection pattern 430 in the extending direction of the patterns (e.g., parallel to the y direction). That is, a portion of the edge of the third connection pattern 430 may protrude from the second connection pattern 420.

It will be noted that, herein, in a case where an orthogonal projection of a pattern (e.g., the first connection pattern or the second connection pattern) on the base substrate is described, a thickness of the pattern may be ignored. That is, the orthogonal projection of the pattern on the base substrate may be an orthogonal projection of an upper surface of the pattern (i.e., a surface of the pattern away from the base substrate) on the base substrate, or may be an orthogonal projection of a lower surface of the pattern (i.e., a surface of the pattern proximate to the base substrate) on the base substrate. For example, the orthogonal projection of the pattern on the base substrate may be an orthogonal projection of a surface with a larger area in the upper surface and the lower surface of the pattern on the base substrate.

The orthogonal projection of the second connection pattern 420 on the base substrate 100 may be further within an orthogonal projection of the first connection pattern 410 on the base substrate 100. In this case, a positional relationship of the two orthogonal projections may be one of the following two cases.

In a first case, referring to FIG. 4A, there is an annular gap between a border of the orthogonal projection of the second connection pattern 420 on the base substrate 100 and a border of the orthogonal projection of the first connection pattern 410 on the base substrate 100, so that a structure that a whole edge of the second connection pattern 420 is indented inward compared to the first connection pattern 430 in FIG. 3 is formed. In this case, in the first connection portion 400, the whole edge of the second connection pattern 420 may be indented inward compared to an edge of the first connection pattern 410 in the extending direction of the patterns (e.g., parallel to the y direction). That is, the whole edge of the first connection pattern 410 may protrude from the second connection pattern 420. As described above, the whole edge of the third connection portion 430 may protrude from the second connection pattern 420. In this case, the first connection portion 400 having an "I"-shaped section in FIG. 4A may be formed.

In a second case, referring to FIG. 4B, a portion of the border of the orthogonal projection of the second connection pattern 420 on the base substrate 100 coincides with a portion of the border of the orthogonal projection of the first connection pattern 410 on the base substrate 100, and another portion of the border of the orthogonal projection of the second connection pattern 420 on the base substrate 100 is indented inward compared to another portion of the border of the orthogonal projection of the first connection pattern 410 on the base substrate 100. In this case, in the first connection portion 400, a portion of the edge of the second connection pattern 420 may be indented inward compared to the edge of the first connection pattern 410 in the extending direction of the patterns (e.g., parallel to the y direction). That is, a portion of the edge of the first connection pattern 410 may protrude from the second connection pattern 420.

On this basis, the first opening 330 of the first insulating layer 300 may expose at least a portion of the first connection pattern 410, at least a portion of the second connection pattern 420, and at least a portion of the third connection pattern 430. For example, FIG. 3 shows a positional relationship between an orthogonal projection of a lower edge 330a of the first opening 330 on the base substrate 100 and each of the orthogonal projection of the first connection pattern 410 of the first connection portion 400 on the base substrate, the orthogonal projection of the second connection pattern 420 on the base substrate 100 and the orthogonal projection of the third connection pattern 430 on the base substrate 100.

A lower edge of an opening may be an edge of the opening proximate to the base substrate, and accordingly, an upper edge of an opening may be an edge of the opening away from the base substrate. Referring to FIG. 4A, for example, the lower edge 330a of the first opening 330 may be an edge of the first opening 330 proximate to the base substrate 100.

On this basis, the orthogonal projection of the second connection pattern 420 on the base substrate 100 and the orthogonal projection of the third connection pattern 430 on the base substrate 100 may be within an orthogonal projection of the lower edge 330a of the first opening 330 on the base substrate 100. In this case, there may be an annular gap between the border of the orthogonal projection of the second connection pattern 420 on the base substrate 100 and a border of the orthogonal projection of the lower edge 330a of the first opening 330 on the base substrate 100, and there may be an annular gap between the border of the orthogonal projection of the third connection pattern 430 on the base substrate 100 and the border of the orthogonal projection of the lower edge 330a of the first opening 330 on the base substrate 100. In this case, there is a gap m between a sidewall 330b of the first opening 330 and a side face 430' of the third connection pattern 430 of the first connection portion 400, so that the first opening 330 exposes the side face 430' of the third connection pattern 430, and further exposes a side face 420' of the second connection pattern 420. Moreover, the first connection pattern 410 includes a portion that protrudes from the second connection pattern 420 and is covered by the third connection pattern 430, thus, the first opening 330 may further expose a portion 410' of an upper surface of the first connection pattern 410.

The first insulating layer 300 has the first opening 330. Therefore, when the light-emitting functional layer 220 is formed (e.g., by an evaporation method) on the base substrate 100 with the first insulating layer 300 after the first insulating layer 300 is formed, the light-emitting functional layer 220 may further extend into the first opening 330.

As described above, in the first connection portion 400, since the orthogonal projection of the second connection pattern 420 on the base substrate 100 is within the orthogonal projection of the third connection pattern 430 on the base substrate 100, the edge of the third connection portion 430 may protrude from the second connection pattern 420 in the extending direction of the patterns (e.g., parallel to the y direction). In this case, when the light-emitting functional layer 220 is formed (e.g., by an evaporation process) on the first connection portion 400, a portion of the light-emitting functional layer 220 located in the first opening 330 may be disconnected. That is, the portion of the light-emitting functional layer 220 located in the first opening 330 may be discontinuous. For example, as shown in FIGS. 4A and 4B, the light-emitting functional layer 220 may be disconnected in a region K, so that at least a portion of the first connection portion 400 (e.g., the side face 430' of the third connection portion 430 and the side face 420' of the second connection portion 420) is not covered by the light-emitting functional layer 220. In this way, when the second electrode 230 is subsequently formed, for example, when the second electrode 230 is formed by the sputtering process, the second electrode 230 may extend into the first opening 330. Moreover, a portion of the second electrode 230 located in the first opening 330 may be in contact with at least one of the first connection pattern 410, the second connection pattern 420 and the third connection pattern 430 of the first connection portion 400. For example, as shown in FIGS. 4A and 4B, the second electrode 230 may be in contact with the side face 420' of the second connection pattern 420; the second electrode 230 may further be in contact with the side face 430' of the third connection pattern 430. In this way, it is possible to achieve that the second electrode 230 is coupled to the first connection portion 400.

Further, as described above, since the orthogonal projection of the second connection pattern 420 on the base substrate 100 may be within the orthogonal projection of the first connection pattern 410 on the base substrate 100, the first connection pattern 410 may protrude from the second connection pattern in the extending direction of the patterns (e.g., parallel to the y direction), so that the first connection portion 400 may have the "I"-shaped section. For example, in the region K, in the first connection portion 400, the second connection pattern 420 is indented inward compared to the first connection pattern 410 and the third connection pattern 430 in the extending direction of the patterns (e.g., parallel to the y direction), so that the first connection portion 400 having the "I"-shaped section is formed. The upper surface of the first connection pattern 410 includes the portion 410' that protrudes from the second connection pattern 420 and is covered by the third connection pattern 430, so that the portion 410' of the upper surface of the first connection pattern 410 may not be covered by the light-emitting functional layer 220 when the light-emitting functional layer 220 is formed, so that the portion of the second electrode 230 located in the first opening 330 may at least be in contact with the first connection pattern 410 (for example, being in contact with the portion 410' of the upper surface of the first connection pattern 410). In this way, compared to a situation where the second electrode 230 is only in contact with the side face 420' of the second connection pattern 420 and/or the side face 430' of the third connection pattern 430, a contact area between the second electrode 230 and the first connection portion 400 may be increased, which may improve a yield of a product.

Further, a manner in which the first connection portion is coupled to the auxiliary electrode line will be described below.

As shown in FIGS. 3, 4A and 4B, the light-emitting substrate EP provided by the embodiments of the present disclosure further includes a second connection portion 10. The second connection portion 10 is disposed above the base substrate 100, and is disposed on a side of the first connection portion 400 proximate to the base substrate 100 and a side of the auxiliary electrode line 20 away from the base substrate 100. For example, in the thickness direction of the light-emitting substrate EP (e.g., parallel to the x direction), the second connection portion 10 may be located between the first connection portion 400 and the auxiliary electrode line 20.

The second connection portion 10 may be configured to be in contact with the first connection portion 400 and the auxiliary electrode line 20, so that the first connection portion 400 is coupled to the auxiliary electrode line 20 through the second connection portion 10. A manner in which the first connection portion 400 is in contact with the second connection portion 10 will be described below.

In some embodiments, as shown in FIGS. 4A and 4B, the light-emitting substrate EP further includes a second insulating layer 700 and a third insulating layer 800. The second insulating layer 700 and the third insulating layer 800 are sequentially stacked above the base substrate 100 in the direction moving away from the base substrate 100 (e.g., the x direction). That is, the second insulating layer 700 is closer to the base substrate 100 than the third insulating layer 800. Both the second insulating layer 700 and the third insulating layer 800 are located on the side of the first connection portion 400 proximate to the base substrate 100 and a side of the second connection portion 10 away from the base substrate 100. For example, in the thickness direction of the light-emitting substrate EP (e.g., parallel to the x direction), both the second insulating layer 700 and the third insulating layer 800 are located between the first connection portion 400 and the second connection portion 10. For example, the first connection portion 400 is located on a side of the third insulating layer 800 away from the base substrate 100, and the second connection portion 10 is located on a side of the second insulating layer 700 proximate to the base substrate 100.

The second insulating layer 700 has a third opening 710, and the third insulating layer 800 has a fourth opening 810.

An orthogonal projection of an upper edge 710a of the third opening 710 on the base substrate 100 is within an orthogonal projection of a lower edge 810a of the fourth opening 810 on the base substrate 100, and the orthogonal projection of the upper edge 710a of the third opening 710 on the base substrate 100 overlaps with an orthogonal projection of the second connection portion 10 on the base substrate 100.

It will be noted that, the upper edge 710a of the third opening 710 may be an edge of the third opening 710 away from the base substrate 100, and the lower edge 810a of the fourth opening 810 may be an edge of the fourth opening 810 proximate to the base substrate 100. Reference may be made to the description of the edge of the opening described above, which will not be repeated here.

The third opening 710 and the fourth opening 810 have the above structures, so that the first connection portion 400 disposed on the side of the third insulating layer 800 away from the base substrate 100 may be in contact with the second connection portion 10 disposed on the side of the second insulating layer 700 proximate to the base substrate 100 through the fourth opening 810 and the third opening 710. That is, the first connection portion 400 is in direct contact with the second connection portion 10.

In addition, since a size of the upper edge 710a of the third opening 710 is smaller than a size of the lower edge 810a of the fourth opening 810, it is convenient to control positional accuracy of the openings when the third opening 710 and the fourth opening 810 are manufactured.

A manner in which the second connection portion 10 is coupled to the auxiliary electrode line 20 will be described below.

In some embodiments, as shown in FIGS. 4A and 4B, in the thickness direction of the light-emitting substrate EP (e.g., parallel to the y direction), a fourth insulating layer 900 is provided between the second connection portion 10 and the auxiliary electrode line 20. The fourth insulating layer 900 may be an interlayer dielectric layer. The fourth insulating layer 900 may have a seventh opening 910. An orthogonal projection of a lower edge 910a of the seventh opening 910 on the base substrate 100 overlaps with the orthogonal projection of the second connection portion 10 on the base substrate 100, and the orthogonal projection of the lower edge 910a of the seventh opening 910 on the base substrate 100 overlaps with an orthogonal projection of the auxiliary electrode line 20 on the base substrate 100. In this way, the second connection portion 10 may be in direct contact with the auxiliary electrode line 20 through the seventh opening 910 in the fourth insulating layer 900.

Figure 5:
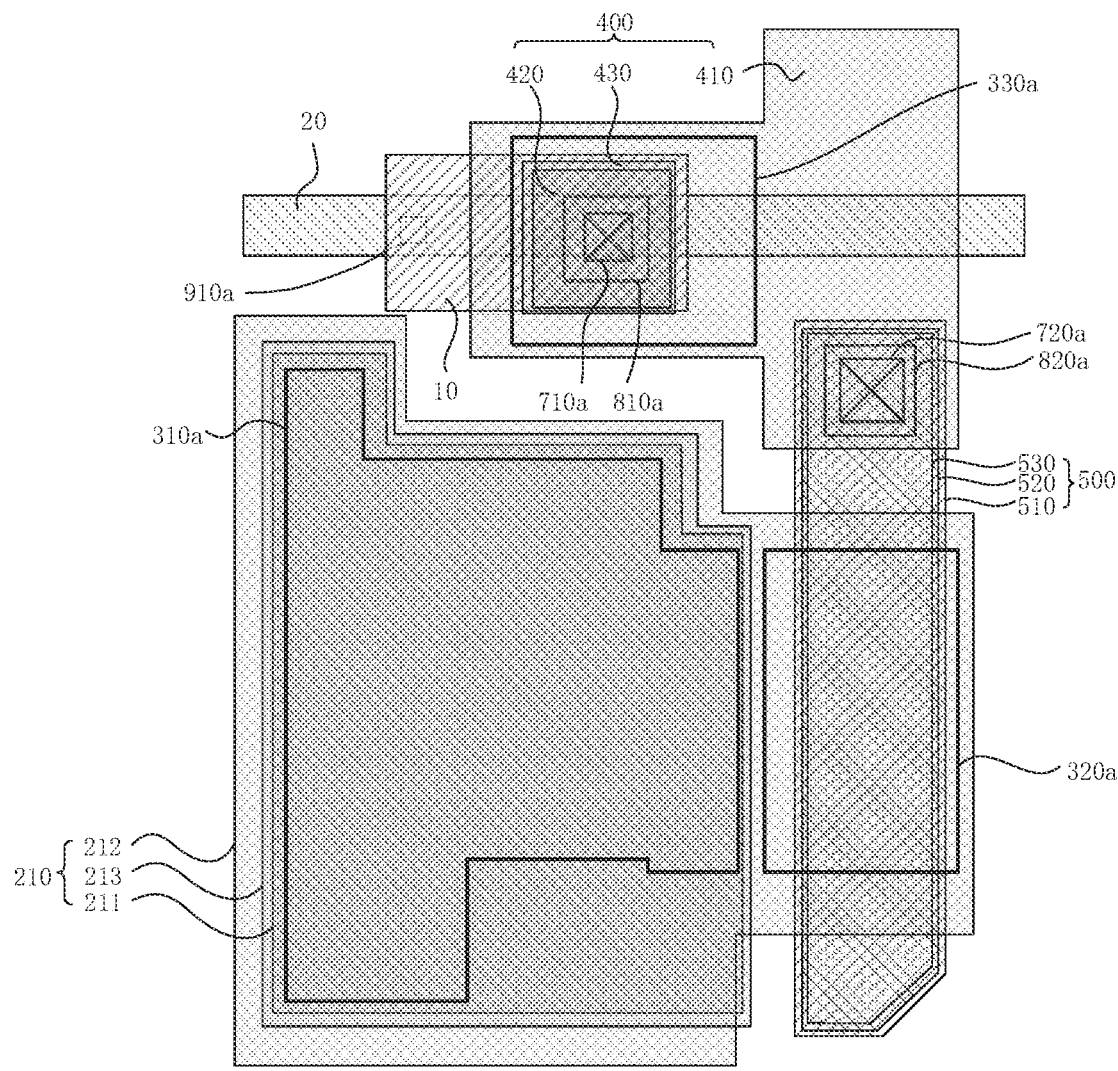
FIG. 5 is a partial top view of another light-emitting substrate, in accordance with some embodiments.

In some possible implementations, referring to FIG. 5, the orthogonal projection of the lower edge 910a of the seventh opening on the base substrate is non-overlap with the orthogonal projection of the lower edge 810a of the fourth opening on the base substrate. In this case, the second connection portion 10 may extend into the seventh opening, so that the second connection portion 10 is coupled to the auxiliary electrode line 20 through the seventh opening.

Based on the above description, the second connection portion 10 may be coupled to the auxiliary electrode line 20, and the second connection portion 10 may further be coupled to the first connection portion 400. In this way, the auxiliary electrode line 20 is coupled to the first connection portion 400.

Figure 6:
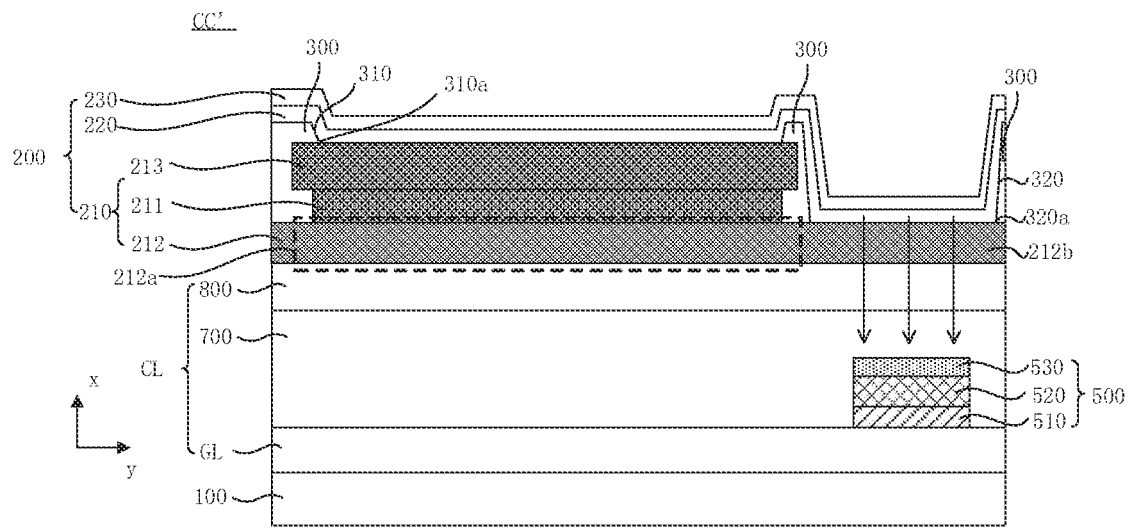
FIG. 6 is a sectional view of the light-emitting substrate in FIG. 3 taken along the line CC', in accordance with some embodiments.

Referring to FIGS. 3 and 6, the light-detecting device 500 is disposed on the base substrate 100 and is configured to detect light emitted by the light-emitting device 200. For example, the light-detecting device 500 may be disposed on a side of the first electrode 210 of the light-emitting device 200 away from the light-emitting functional layer 220. For example, in the thickness direction of the light-emitting substrate EP (e.g., parallel to the x direction), the light-detecting device 500 is located between the first electrode 210 of the light-emitting device 200 and the base substrate 100. For example, a light-detecting device 500 may be configured to detect light emitted by a light-emitting device. For another example, a light-detecting device 500 may be configured to detect light emitted by a plurality of light-emitting devices.

A specific type of the light-detecting device 500 is not particularly limited in the present disclosure, as long as the light-detecting device 500 may detect a luminous intensity of the light-emitting device and generate a detection signal, so as to realize optical compensation of the light-emitting device 200. For example, the light-detecting device 500 may be a positive intrinsic negative (PIN) photodiode.

The light-detecting device 500 may include a third electrode 510 and a fourth electrode 530. The light-detecting device 500 may further include a semiconductor pattern 520.

In some embodiments, the semiconductor pattern 520 of the light-detecting device 500 may include an n-type semiconductor layer, an intrinsic semiconductor layer, and a p-type semiconductor layer. The intrinsic semiconductor layer may be lightly doped, so that the light-detecting device 500 has a good photosensitive performance.

In order for the light-detecting device 500 to work normally, an electrical signal may be transmitted to the fourth electrode 530 of the light-detecting device 500. When the light-detecting device 500 is irradiated with light, a resistance of the semiconductor pattern 520 of the light-detecting device 500 will change, and the resistance thereof varies based on different light intensity, so that the light intensity received by the light-detecting device 500 may be detected according to a magnitude of an electrical signal form the third electrode 510 of the light-detecting device. Therefore, the fourth electrode 530 of the light-detecting device 500 may be coupled to a signal line to transmit an electrical signal to the fourth electrode 530.

In some embodiments, the fourth electrode 530 of the light-detecting device 500 may be coupled to the auxiliary electrode line. As mentioned above, the auxiliary electrode line may further be coupled to the second electrode of the light-emitting device. In this way, the auxiliary electrode line may not only serve as an auxiliary electrode of the second electrode in the light-emitting device, but also provide an electrical signal for the light-detecting device 500. Compared to using a separate signal line to provide an electrical signal for the light-detecting device 500, such arrangement may save one path of signal.

In some embodiments, the fourth electrode 530 may be coupled to the auxiliary electrode line through the first connection portion 400. A manner in which the first connection portion 400 is coupled to the auxiliary electrode line and the second electrode of the light-emitting device may be as described above, and a manner in which the first connection portion 400 is coupled to the fourth electrode 530 of the light-detecting device 500 will be described below.

A positional relationship among the fourth electrode 530, the auxiliary electrode line, and the first connection portion 400 is as follows.

The fourth electrode 530 may be disposed on a side of the second electrode 230 of the light-emitting device 200 proximate to the base substrate 100, and the auxiliary electrode line may be disposed on a side of the fourth electrode 530 of the light-emitting device 500 proximate to the base substrate 100. For example, in the thickness direction of the light-emitting substrate EP (e.g., parallel to the x direction), the fourth electrode 530 of the light-detecting device 500 may be located between the second electrode 230 of the light-emitting device 200 and the auxiliary electrode line. Further, as described above, the first connection portion 400 may be disposed on a side of the auxiliary electrode line away from the base substrate 100 and a side of the second electrode 230 of the light-emitting device proximate to the base substrate. For example, the first connection portion 400 may be disposed on a side of the fourth electrode 530 away from the base substrate 100, that is, the first connection portion 400 may be disposed between the fourth electrode 530 and the second electrode 230 of the light-emitting device in the thickness direction of the light-emitting substrate EP (e.g., parallel to the x direction).

Figure 7:
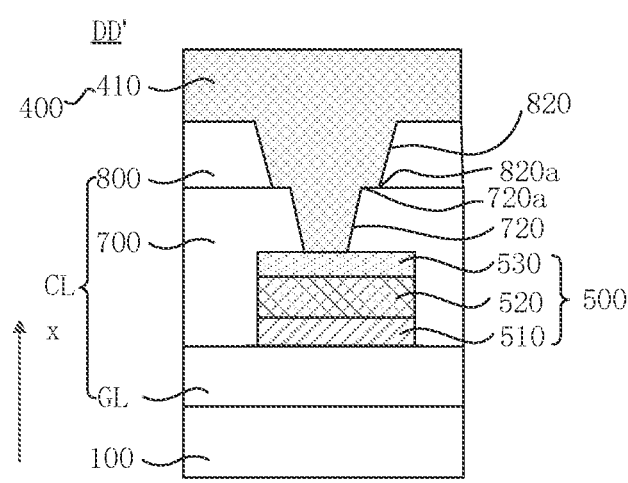
FIG. 7 is a sectional view of the light-emitting substrate in FIG. 3 taken along the line DD', in accordance with some embodiments.

A positional relationship among the light-detecting device 500, the first connection portion 400, and the light-emitting device (the position of the light-emitting device may be a position of the first electrode 210 of the light-emitting device) may be as shown in FIG. 3. FIG. 7 is a sectional view of the light-emitting substrate taken along the section line DD' in FIG. 3. Referring to FIGS. 3 and 7, the light-emitting substrate EP further includes the second insulating layer 700 and the third insulating layer 800, and positions of the second insulating layer 700 and the third insulating layer 800 in the light-emitting substrate EP may be as described above. Further, the second insulating layer 700 and the third insulating layer 800 may be located on a side of the first connection pattern 410 of the first connection portion 400 proximate to the base substrate 100 and a side of the fourth electrode 530 away from the base substrate 100. That is, in the thickness direction of the light-emitting substrate EP (e.g., parallel to the x direction), the second insulating layer 700 and the third insulating layer 800 are located between the first connection pattern 410 of the first connection portion 400 and the fourth electrode 530 of the light-emitting device 500. For example, the first connection pattern 410 of the first connection portion 400 is located on a side of the third insulating layer 800 away from the base substrate, and the fourth electrode 530 is located on a side of the second insulating layer 700 proximate to the base substrate 100.

The second insulating layer 700 may further include a fifth opening 720, and the third insulating layer 800 may further include a sixth opening 820. An orthogonal projection of an upper edge 720a of the fifth opening 720 on the base substrate 100 is within an orthogonal projection of a lower edge 820a of the sixth opening 820 on the base substrate 100, and the orthogonal projection of the upper edge 720a of the fifth opening 720 on the base substrate 100 overlaps with an orthogonal projection of the fourth electrode 530 on the base substrate 100.

It will be noted that, the upper edge 720a of the fifth opening 720 is an edge of the fifth opening 720 away from the base substrate 100, and the lower edge 820a of the sixth opening 820 is an edge of the sixth opening 820 proximate to the base substrate 100. Reference may be made to the description of the upper edge and the lower edge of the opening described above, which will not be repeated here.

Since the second insulating layer 700 and the third insulating layer 800 have the above structures, the first connection portion 400 disposed on the side of the third insulating layer 800 away from the base substrate 100 may be in direct contact with the fourth electrode 530 disposed on the side of the second insulating layer 700 proximate to the base substrate 100 through the fifth opening 720 and the sixth opening 820. Based on the above description, in the first connection portion 400, the first connection pattern 410 is closest to the base substrate 100. Therefore, in some embodiments, the orthogonal projection of the first connection pattern 410 on the base substrate 100 may overlap with the orthogonal projection of the upper edge 720a of the fifth opening 720 on the base substrate 100, and may also overlap with the orthogonal projection of the lower edge 820a of the sixth opening 820 on the base substrate 100. In this way, the first connection pattern 410 may be in contact with the fourth electrode 530 through the fifth opening 720 and the sixth opening 820, thereby achieving that the first connection portion 400 is coupled to the fourth electrode 530.

In some embodiments, the first insulating layer 300 may further include second opening(s). A light-emitting device 200 may correspond to one second opening, or a light-emitting device 200 may correspond to two second openings. For example, referring to FIGS. 3 and 6, the light-emitting device 200 may correspond to a second opening 310 and a second opening 320. For example, an orthogonal projection of a lower edge of the second opening on the base substrate 100 may be within an orthogonal projection of the first electrode 210 on the base substrate 100. For example, an orthogonal projection of a lower edge 310a of the second opening 310 on the base substrate 100 may be within the orthogonal projection of the first electrode 210 on the base substrate 100, and an orthogonal projection of a lower edge 320a of the second opening 320 on the base substrate 100 may be within the orthogonal projection of the first electrode 210 on the base substrate 100. In this way, portion(s) of the light-emitting functional layer 220 located in the second opening(s) may be in contact with the first electrode 210, and may emit light under the driving of the first electrode 210, so that the corresponding light-emitting device 200 may emit light. For example, a portion of the light-emitting functional layer 220 located in the second opening 310 may be in contact with the first electrode 210, and a portion of the light-emitting functional layer 220 located in the second opening 320 may also be in contact with the first electrode 210, so that the portion of the light-emitting functional layer 220 located in the second opening 310 and the portion of the light-emitting functional layer 220 located in the second opening 320 may both emit light under the driving of the first electrode 210. In this way, the portion of the light-emitting functional layer 220 located in the second opening 310 and the portion of the light-emitting functional layer 220 located in the second opening 320 may emit light or may not emit light simultaneously.

In some embodiments, referring to FIGS. 3 and 6, the first electrode 210 of the light-emitting device 200 may include a first sub-electrode 212, a second sub-electrode 211, and a third sub-electrode 213 that are sequentially stacked in the direction moving away from the base substrate 100 (i.e., the x direction). For example, in the thickness direction of the light-emitting substrate EP (e.g., parallel to the x direction), the second sub-electrode 211 may be located between the first sub-electrode 212 and the third sub-electrode 213.

The first sub-electrode 212 may be a transparent conductive electrode, and a material thereof may be metal oxide, such as indium tin oxide (ITO), or indium zinc oxide (IZO). The second sub-electrode 211 may be a reflective electrode, so that the first electrode 210 may reflect light. A material of the second sub-electrode 211 may be metal, such as aluminum (Al). For example, in the case where the light-emitting device 200 is the top emission light-emitting device, a portion of light emitted by the light-emitting functional layer 220 included in the light-emitting device 200 directly exits from the second electrode 230, and a portion of light emitted by the light-emitting functional layer 220 in a direction toward the first electrode 210 may be reflected by the second sub-electrode 211, so that the light may also exit from the second electrode 230, which improves light exit amount. A material of the third sub-electrode 213 may include a material with a high work function. For example, the material of the third sub-electrode 213 may be metal oxide, such as indium tin oxide (ITO), or indium zinc oxide (IZO). In this case, in the first electrode 210 of the light-emitting device 200, the third sub-electrode 213 may be configured to contact the light-emitting functional layer 220 and inject holes into the light-emitting functional layer 220. Since the material of the third sub-electrode 213 includes the material with the high work function, it is easy for the first electrode 210 to inject holes into the light-emitting functional layer 220.

Figure 8:
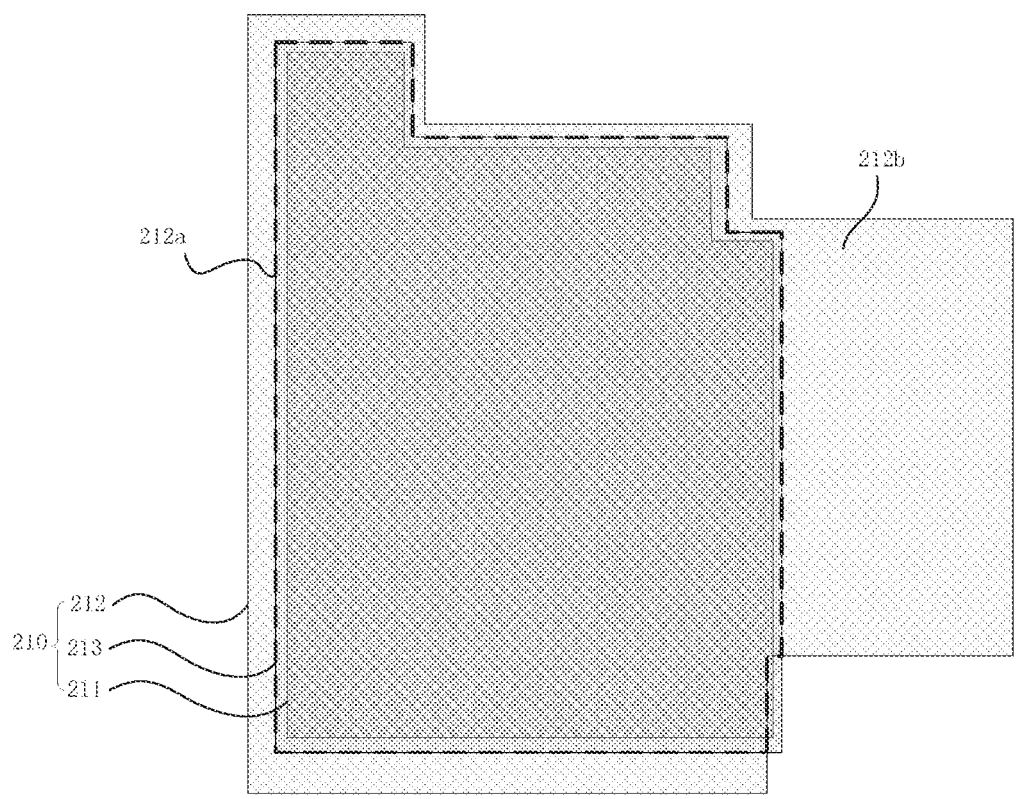
FIG. 8 is a structural diagram of a first sub-electrode, a second sub-electrode and a third sub-electrode in a light-emitting substrate, in accordance with some embodiments.

Referring to FIGS. 6 and 8, the first sub-electrode 212 includes a first portion 212a and a second portion 212b except for the first portion 212a. The first portion 212a is covered by the third sub-electrode 213. That is, a portion of the first sub-electrode 212, whose orthogonal projection on the first sub-electrode 212 overlaps with an orthogonal projection of the third sub-electrode 213 on the first sub-electrode 212, is referred to as the first portion 212a of the first sub-electrode 212.

Referring to FIG. 6, the second portion 212b of the first sub-electrode 212 is not covered by the third sub-electrode 213, and an orthogonal projection of the second portion 212b of the first sub-electrode 212 on the base substrate 100 overlaps with an orthogonal projection of the light-emitting device 500 on the base substrate 100. In this way, the light-detecting device 500 may detect light emitted by the light-emitting device 200 by using the second portion 212b of the first sub-electrode 212. For example, the orthogonal projection of the lower edge 320a of the second opening 320 in the first insulating layer on the base substrate 100 is within the orthogonal projection of the second portion 212b of the first sub-electrode 212 on the base substrate 100, so that the second opening 320 may expose at least a portion of the second portion 212b of the first sub-electrode 212. The light-emitting functional layer 220 may further extend onto the at least a portion of the second portion 212b of the first sub-electrode 212 located in the second opening 320, so that in the light-emitting device 200, a portion corresponding to the first portion 212a of the first sub-electrode 212 and a portion corresponding to the second portion 212b of the first sub-electrode 212 may be turned on and off simultaneously. Further, the second portion 212b of the first sub-electrode 212 may be configured to transmit light. For example, the second portion 212b of the first sub-electrode 212 may be transparent or translucent, so that the light emitted by the light-emitting device 200 may be incident on the light-detecting device 500 located below the second portion 212b of the first sub-electrode 212 directly through the second portion 212b of the first sub-electrode 212. For another example, the second portion 212b of the first sub-electrode 212 may have an opening, so that the light emitted by the light-emitting device 200 may be incident on the light-detecting device 500 located below the opening through the opening. In this way, the light-detecting device 500 can detect the light emitted by the light-emitting device 200. In addition, since a portion of the light-emitting device 200 that is covered by the first insulating layer 300 may not emit light, a size of a light-emitting region that may be detected by the light-detecting device 500 may be determined by the second opening 320. That is, most of the light incident on the light-detecting device 500 is from the second opening 320.

In this way, a source of the light detected by the light-detecting device 500 may be concentrated, and accuracy of the light-detecting device 500 may be improved.

In some embodiments, the fourth electrode 530 of the light-detecting device 500 is closer to the light-emitting device than the third electrode 510, and the fourth electrode 530 is a transparent conductive electrode, and a material thereof may be metal oxide, such as indium tin oxide (ITO), or indium zinc oxide (IZO). In this way, the light emitted by the light-emitting device may be incident onto the semiconductor pattern 520 of the light-detecting device 500 through the transparent fourth electrode 530, so that the detection of the light emitted by the light-emitting device can be performed by the light-detecting device 500.

Figure 9A:
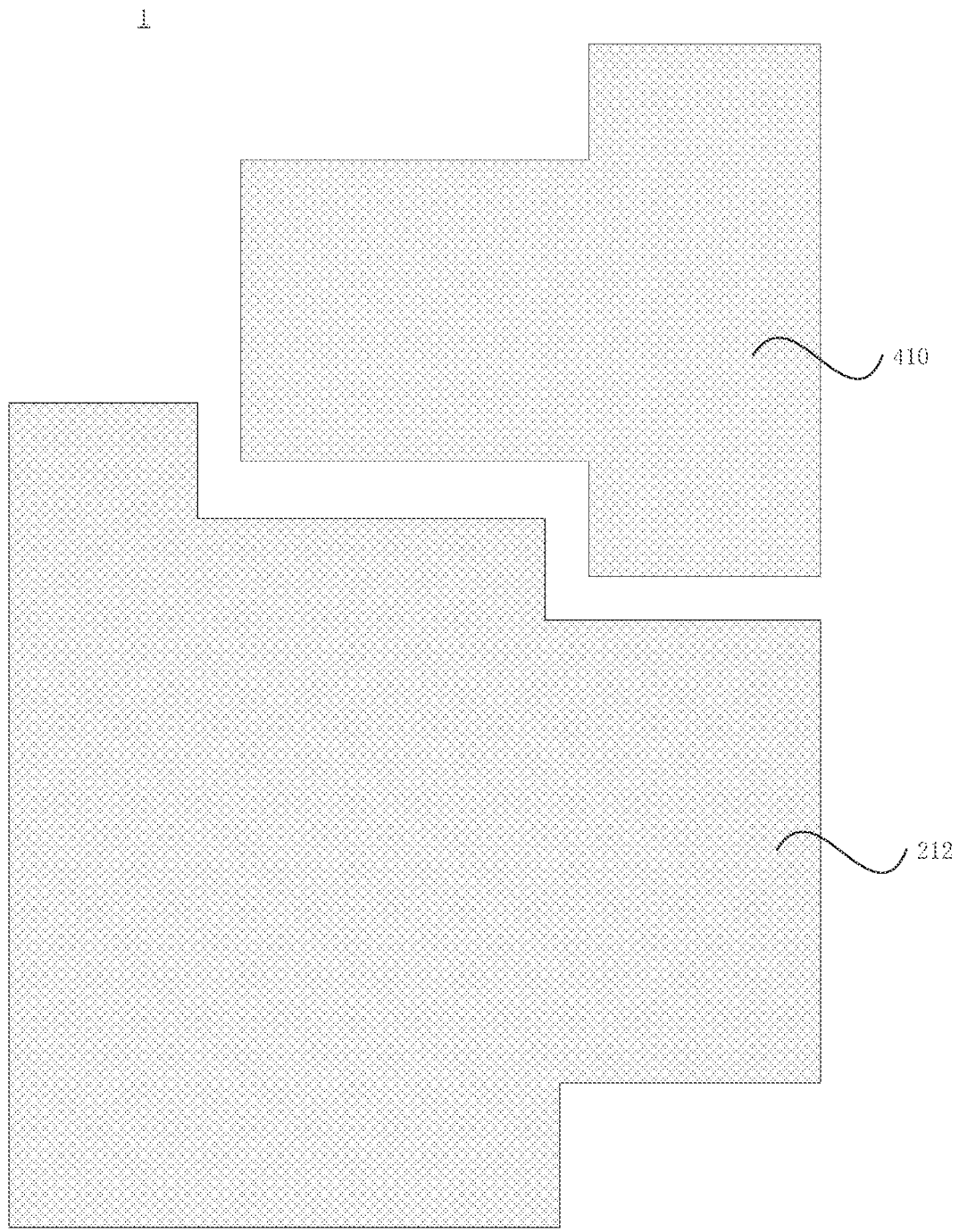
FIG. 9A is a partial top view of a first pattern layer in a light-emitting substrate, in accordance with some embodiments.
Figure 9B:
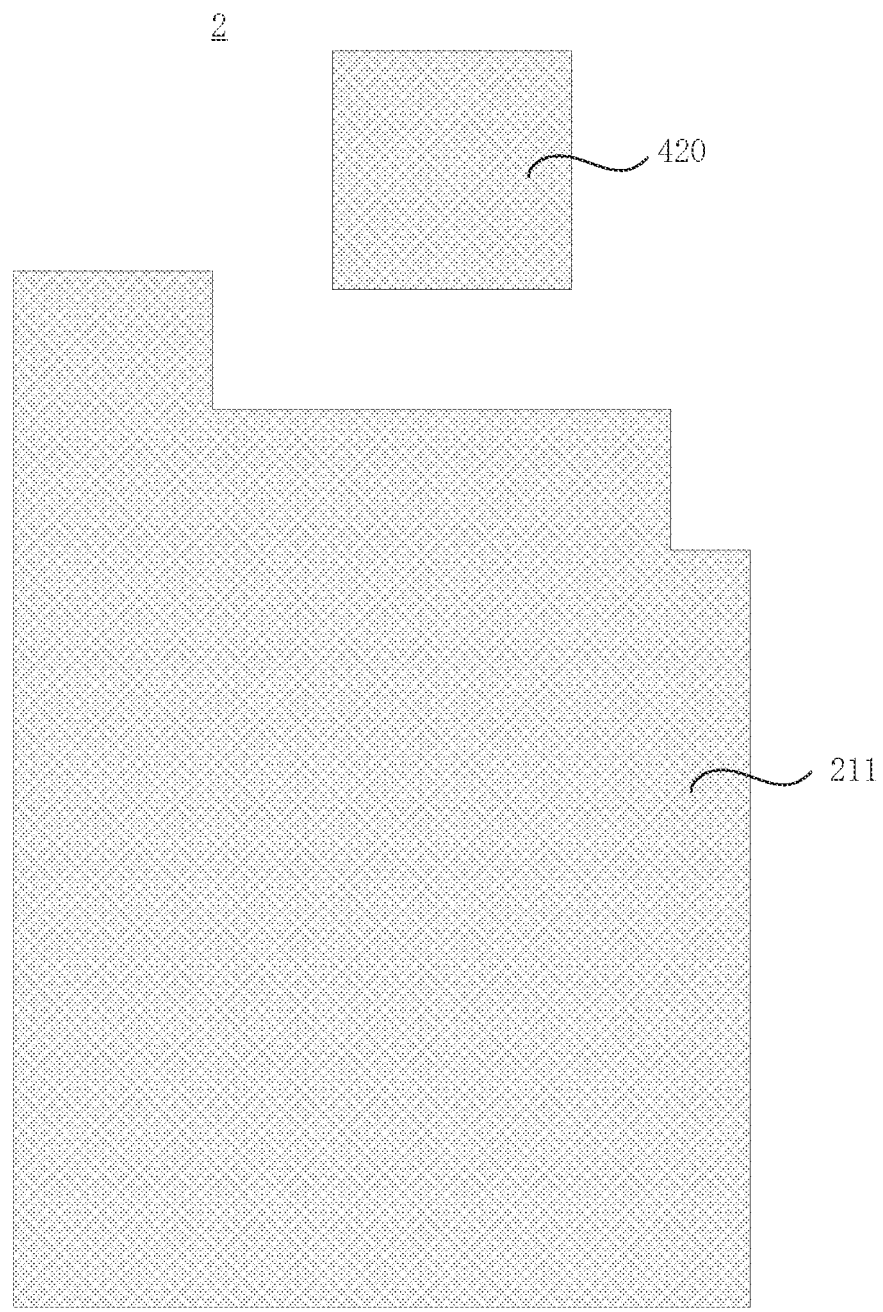
FIG. 9B is a partial top view of a second pattern layer in a light-emitting substrate, in accordance with some embodiments.
Figure 9C:
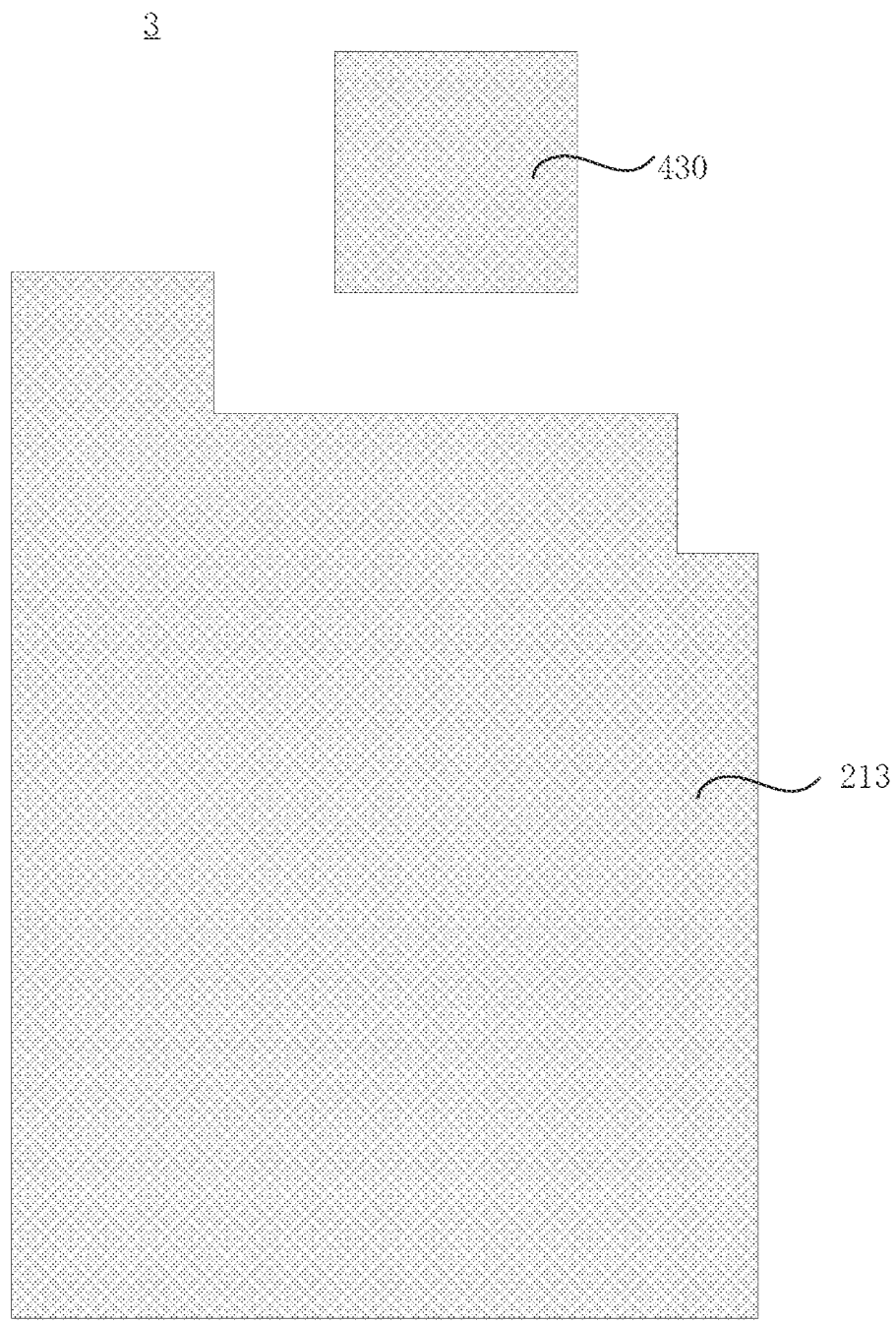
FIG. 9C is a partial top view of a third pattern layer in a light-emitting substrate, in accordance with some embodiments.

In some embodiments, each layer of the first electrode 210 and a respective layer of the first connection portion 400 may be disposed in a same layer. FIG. 9A is a partial top view of a first pattern layer in the light-emitting substrate. FIG. 9B is a partial top view of a second pattern layer in the light-emitting substrate. FIG. 9C is a partial top view of a third pattern layer in the light-emitting substrate. Referring to FIG. 9A, the first pattern layer 1 includes the first connection pattern 410 of the first connection portion and the first sub-electrode 212 of the light-emitting device. That is, the first connection pattern 410 of the first connection portion and the first sub-electrode 212 of the light-emitting device are disposed in a same layer. Referring to FIG. 9B, the second pattern layer 2 includes the second connection pattern 420 of the first connection portion and the second sub-electrode 211 of the light-emitting device. That is, the second connection pattern 420 of the first connection portion and the second sub-electrode 211 of the light-emitting device are disposed in a same layer. Referring to FIG. 9C, the third pattern layer 3 includes the third connection pattern 430 of the first connection portion and the third sub-electrode 213 of the light-emitting device. That is, the third connection pattern 430 of the first connection portion and the third sub-electrode 213 of the light-emitting device are disposed in a same layer.

Each of the pattern layers refers to a layer structure obtained by patterning (i.e., by a patterning process) a film. In some embodiments, a method for manufacturing the first pattern layer 1, the second pattern layer 2 and the third pattern layer 3 may be as follows. The first pattern layer 1 is formed on the base substrate. A conductive film covering the first pattern layer 1 is formed on the base substrate on which the first pattern layer 1 is formed. The conductive film may be, for example, an Al film. The third pattern layer 3 is formed on the base substrate on which the conductive film is formed, and then the conductive film is etched by using the third pattern layer 3 as a mask, so as to pattern the conductive film to form the second pattern layer 2. Materials of the first pattern layer 1 and the third pattern layer 3 may be a transparent conductive material, such as ITO or IZO. In this way, the first pattern layer 1 and/or the third pattern layer 3 may be etched by using an etching solution, and the second pattern layer 2 may be etched by using another different etching solution. In this way, when the second pattern layer 2 is etched, the first pattern layer 1 and the third pattern layer 3 will not be etched.

In some embodiments, the light-emitting substrate may further include a plurality of transistors. The transistors may be thin film transistors. Referring to FIGS. 4A, 4B, 6 and 7, the plurality of transistors may be disposed on the base substrate, for example, may be disposed in a circuit layer CL.

Figure 10:
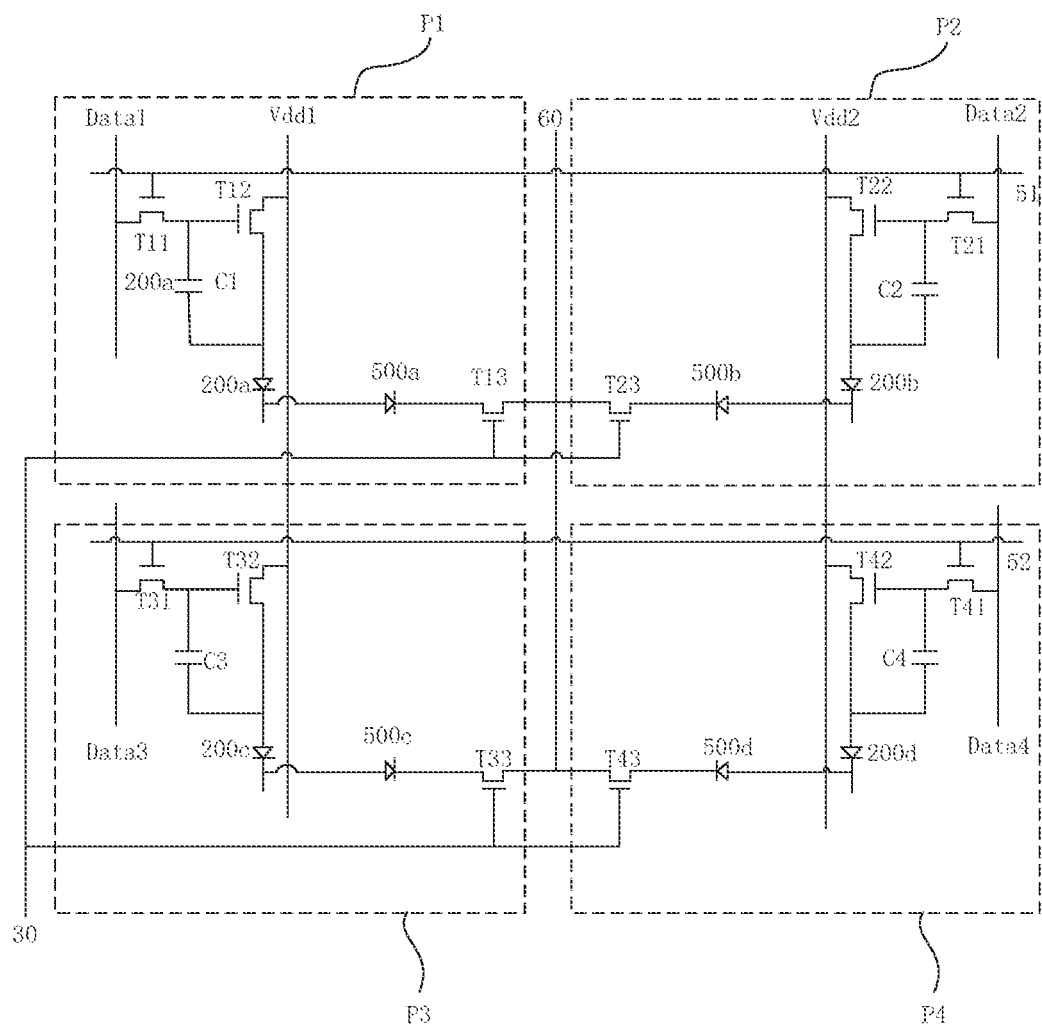
FIG. 10 is an equivalent circuit diagram corresponding to the region X in FIG. 1.

FIG. 10 is an equivalent circuit diagram corresponding to the region X in FIG. 1. Referring to FIG. 10, a sub-pixel unit includes a light-emitting device, and a pixel driving circuit coupled to the light-emitting device to drive the light-emitting device to emit light. The sub-pixel unit further includes a light-detecting device, and a control circuit coupled to the light-detecting device. The pixel driving circuit and the control circuit may include transistors. For example, the pixel driving circuit may include at least one first transistor coupled to the light-emitting device, and the control circuit may include a second transistor coupled to the light-detecting device. For example, the sub-pixel unit P1 is taken as an example, transistors in the sub-pixel unit P1 may include a first transistor T11 and a first transistor T12 that are coupled to the light-emitting device 200a, and a second transistor T13 coupled to a light-detecting device 500a. The first transistor T11 and the first transistor T12 may be disposed in the pixel driving circuit, and the pixel driving circuit is used to drive the light-emitting device 200a to emit light. The second transistor T13 may be disposed in the control circuit of the light-detecting device 500a.

The transistor may include an active layer, a first conductive portion and a second conductive portion that are respectively located on two sides of the active layer and in contact with the active layer, and a gate. Referring to FIGS. 4A, 4B, 6, and 7 in order to form the transistor, the circuit layer CL includes a gate insulating layer GL.

In some embodiments, the first conductive portion may be a drain region of the transistor, and accordingly, the second conductive portion may be a source region of the transistor. In some other embodiments, the first conductive portion may be a source region of the transistor, and accordingly, the second conductive portion may be a drain region of the transistor.

Figure 11:
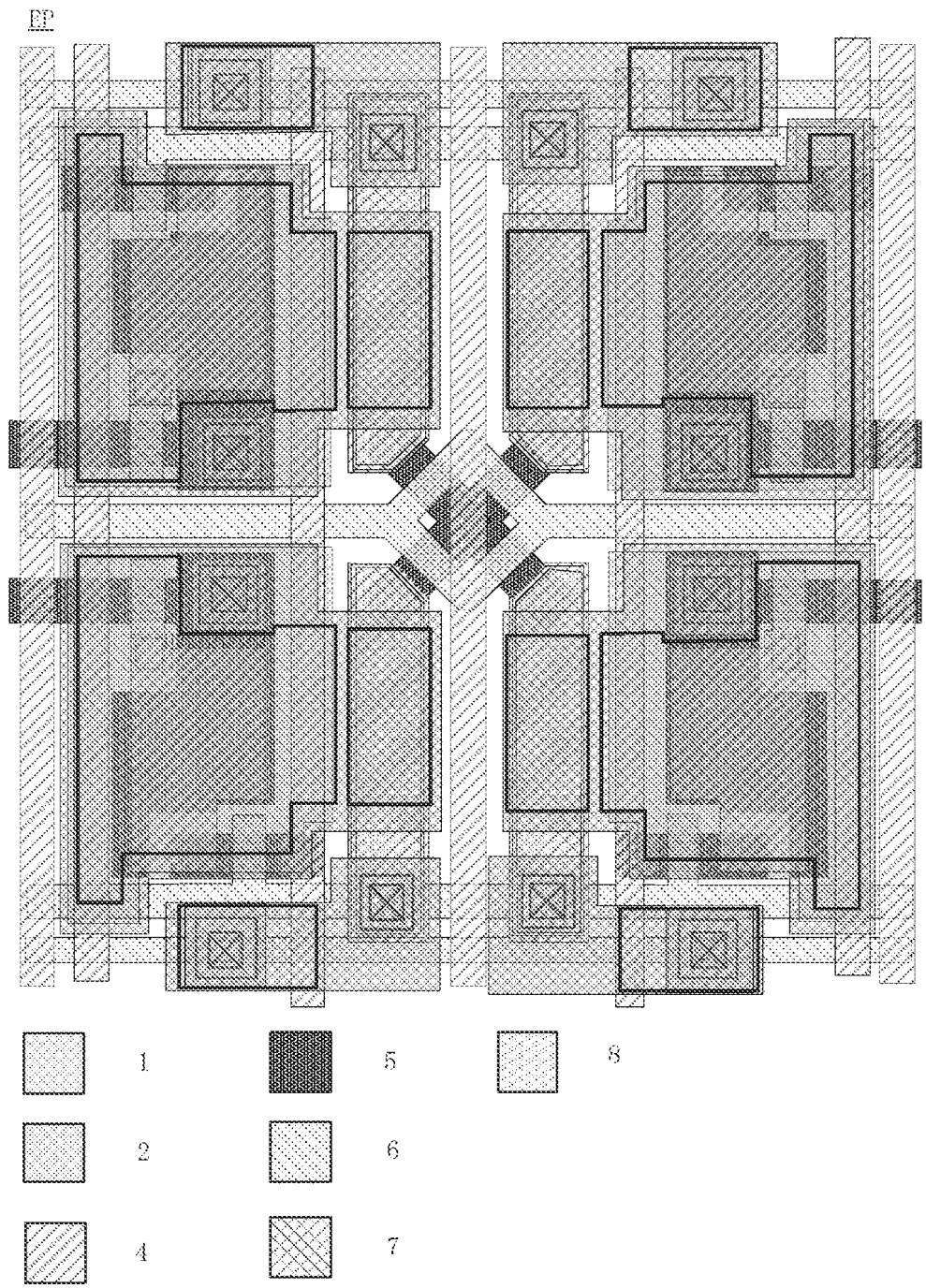
FIG. 11 is a top view of the region X in the light-emitting substrate in FIG. 1.
Figure 12A:
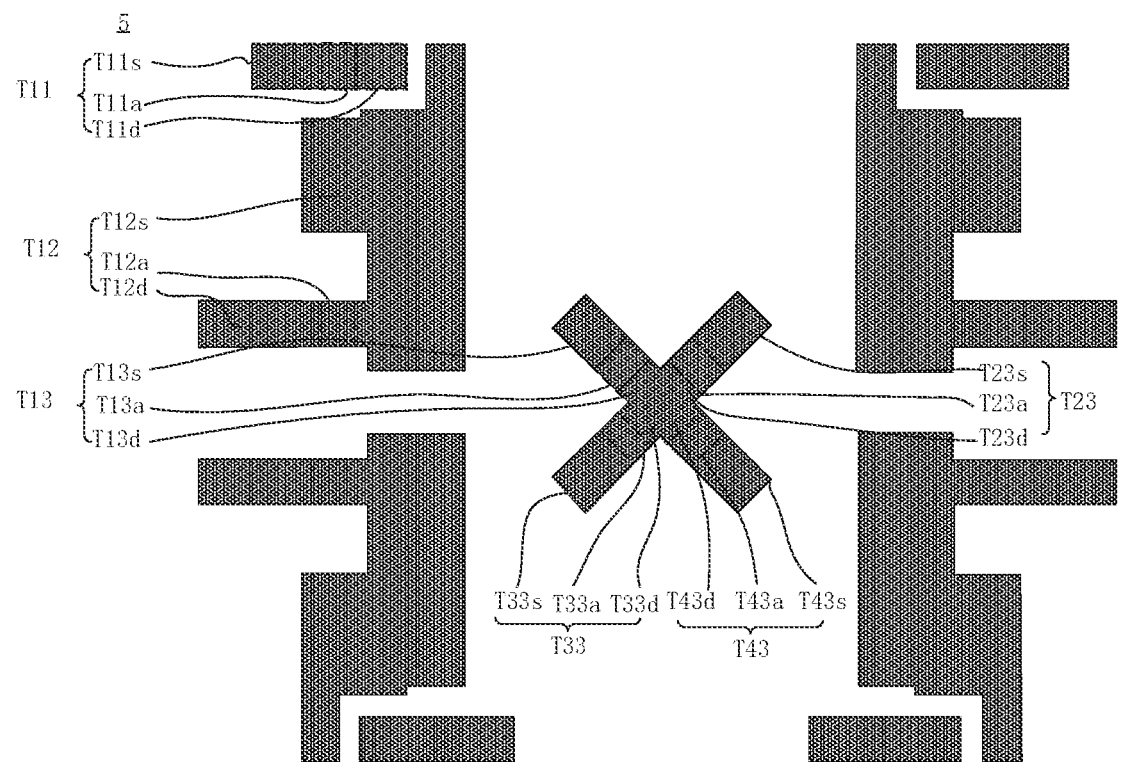
FIG. 12A is a top view of a fifth pattern layer in a light-emitting substrate, in accordance with some embodiments.
Figure 12B:
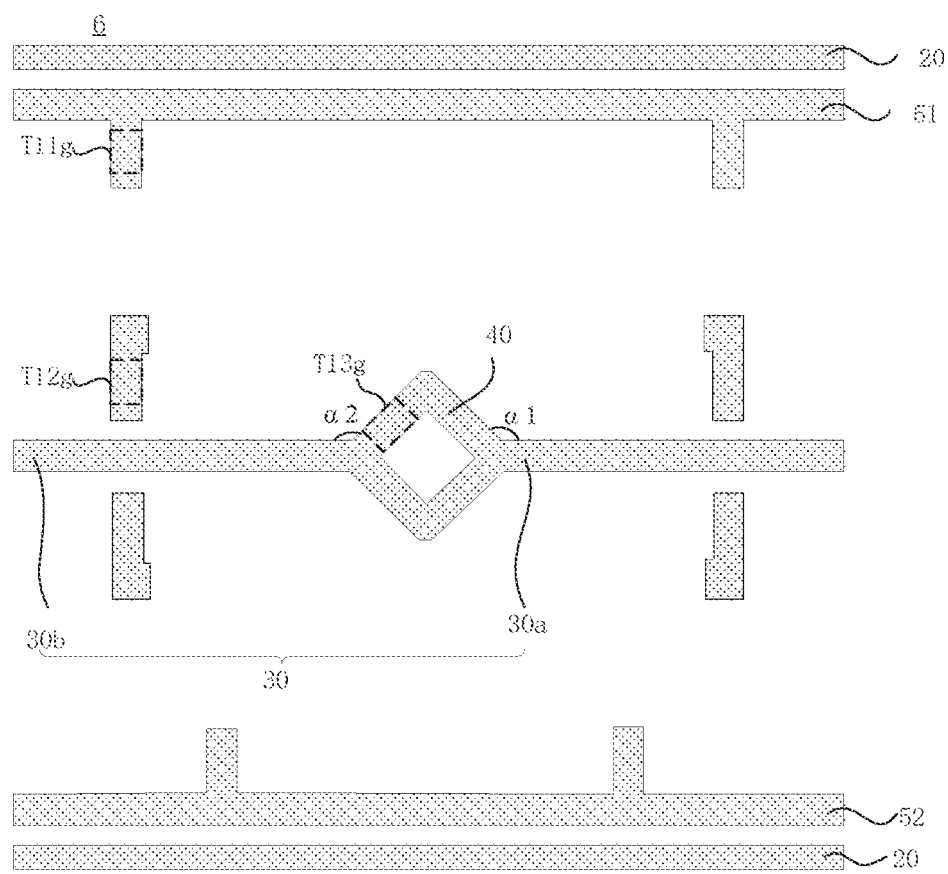
FIG. 12B is a top view of a sixth pattern layer in a light-emitting substrate, in accordance with some embodiments.
Figure 12C:
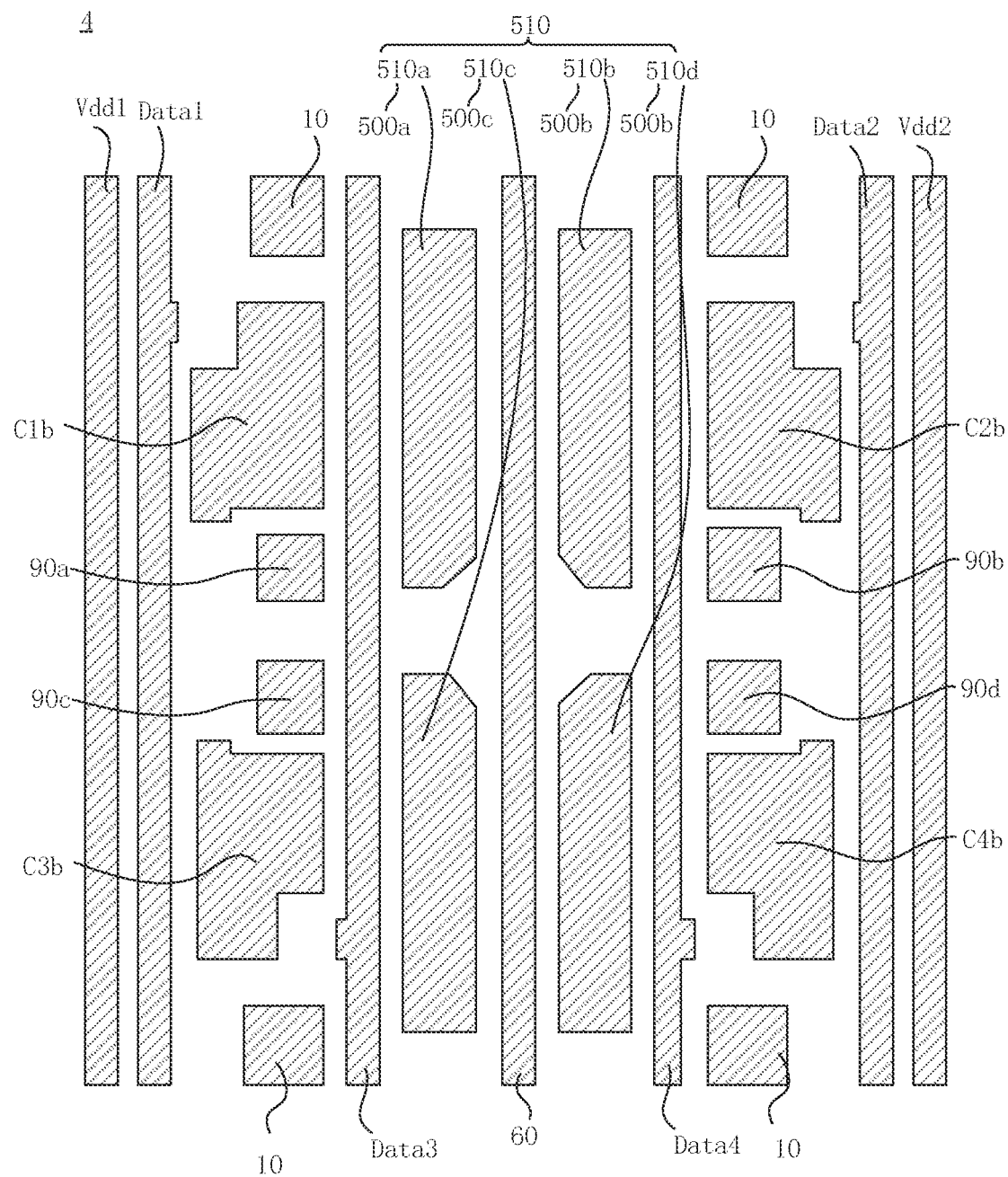
FIG. 12C is a top view of a fourth pattern layer in a light-emitting substrate, in accordance with some embodiments.
Figure 12D:
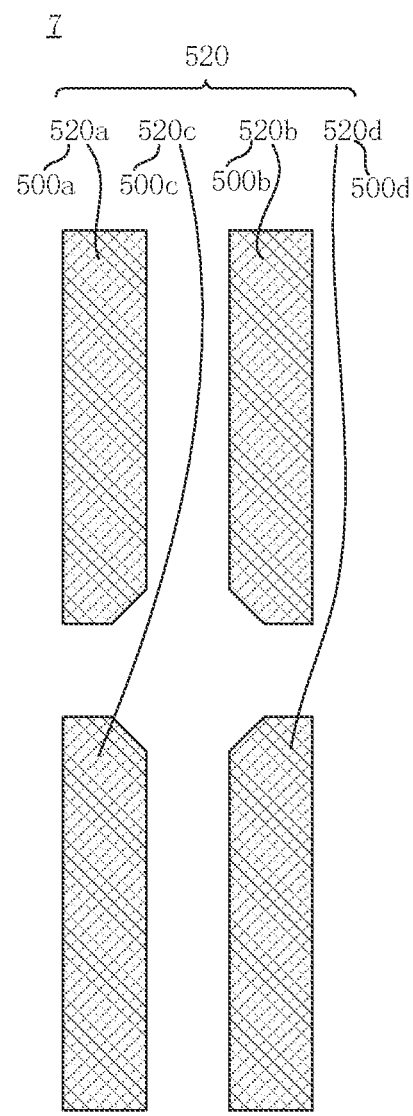
FIG. 12D is a top view of a seventh pattern layer in a light-emitting substrate, in accordance with some embodiments.
Figure 12E:
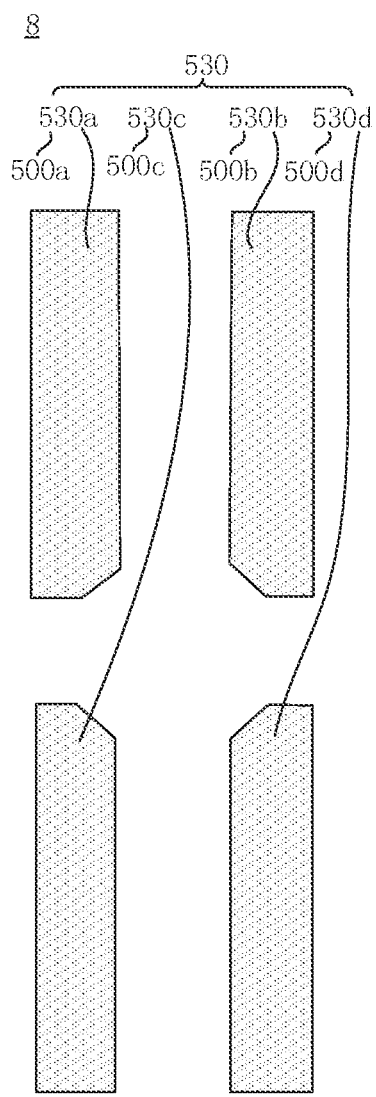
FIG. 12E is a top view of an eighth pattern layer in a light-emitting substrate, in accordance with some embodiments.
Figure 12F:
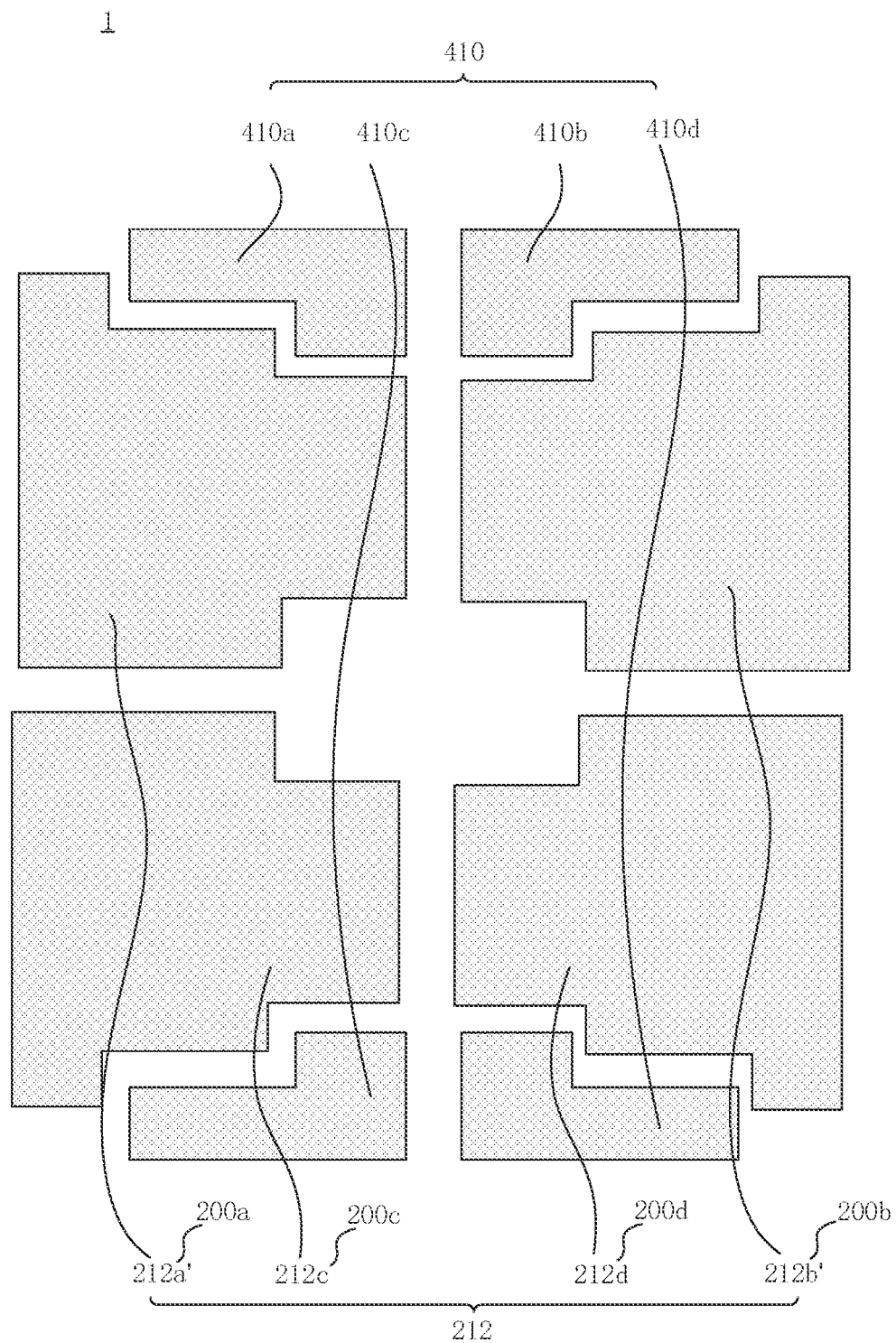
FIG. 12F is a top view of a first pattern layer in another light-emitting substrate, in accordance with some embodiments.
Figure 12G:
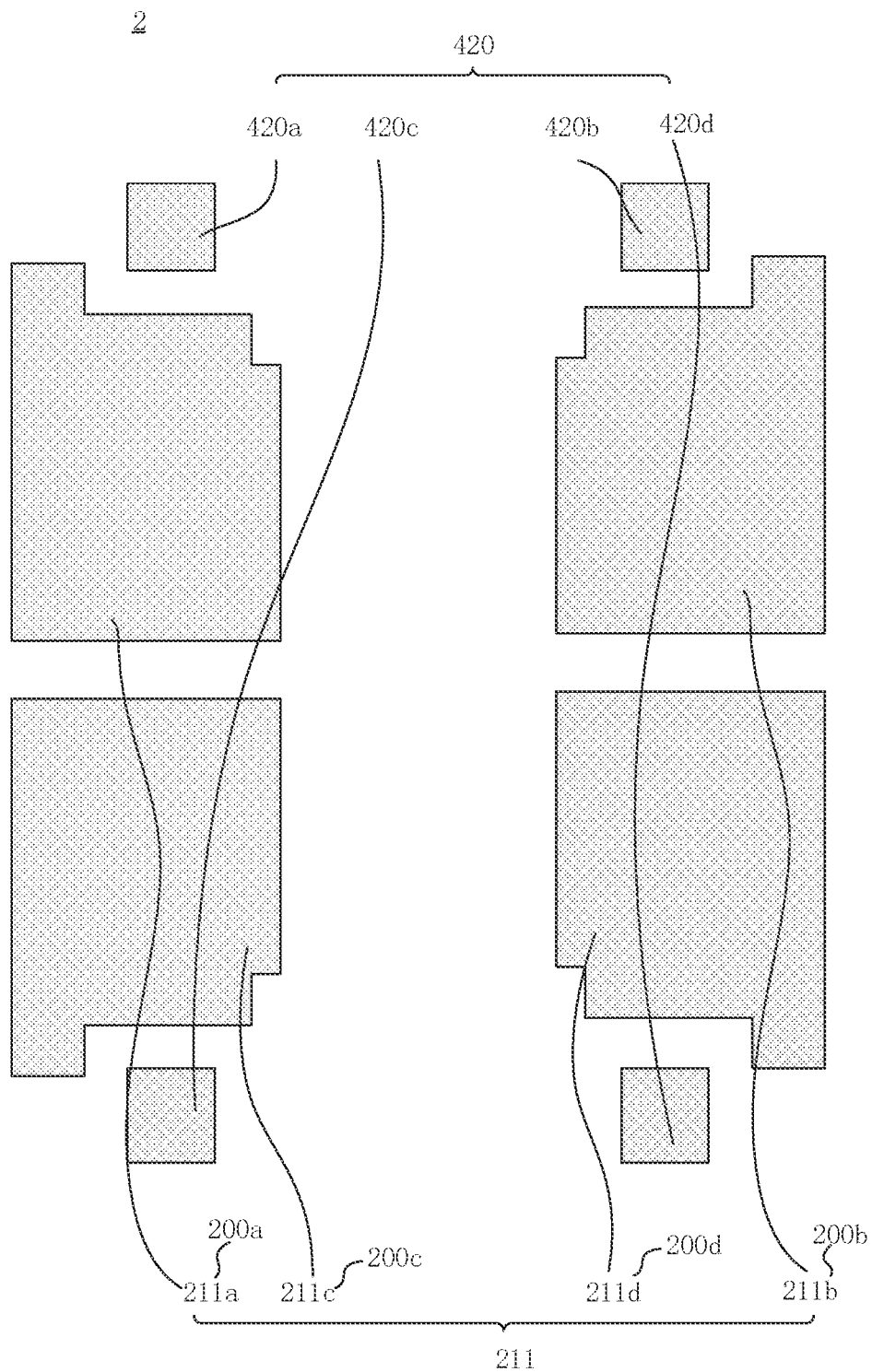
FIG. 12G is a top view of a second pattern layer in another light-emitting substrate, in accordance with some embodiments.
Figure 12H:
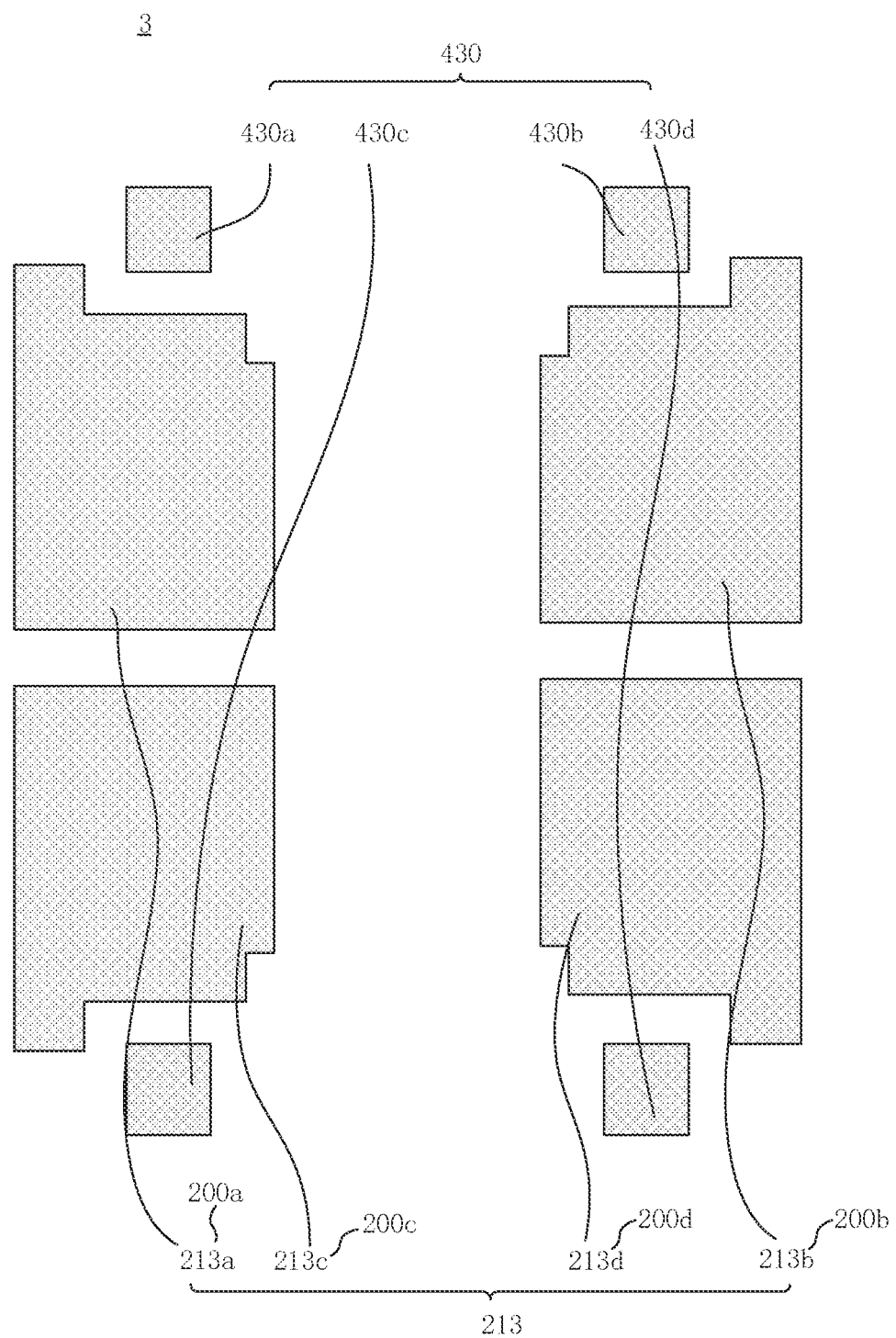
FIG. 12H is a top view of a third pattern layer in another light-emitting substrate, in accordance with some embodiments.

FIG. 11 is a top view of the region X of the light-emitting substrate in FIG. 1, so as to further illustrate the structure of the transistor in the light-emitting substrate. Referring to FIG. 11, the light-emitting substrate EP has a stacked structure including, for example, a fifth pattern layer 5, a sixth pattern layer 6, a fourth pattern layer 4, a seventh pattern layer 7, an eighth pattern layer 8, the first pattern layer 1, the second pattern layer 2, and the third pattern layer 3. A stacking sequence of the pattern layers may be as follows. The fifth pattern layer 5, the sixth pattern layer 6, the fourth pattern layer 4, the seventh pattern layer 7, the eighth pattern layer 8, the first pattern layer 1, the second pattern layer 2, and the third pattern layer 3 are sequentially arranged in the direction moving away from the base substrate. FIG. 12A is a top view of the fifth pattern layer 5, FIG. 12B is a top view of the sixth pattern layer 6, FIG. 12C is a top view of the fourth pattern layer 4, FIG. 12D is a top view of the seventh pattern layer 7. FIG. 12E is a top view of the eighth pattern layer 8, FIG. 12F is a top view of the first pattern layer 1. FIG. 12G is a top view of the second pattern layer 2, and FIG. 12H is a top view of the third pattern layer 3. It will be noted that, shapes and sizes of the second pattern layer 2 and the third pattern layer 3 may be approximately the same respectively. FIG. 11 only shows the second pattern layer 2, and omits the third pattern layer 3.

Figure 13A:
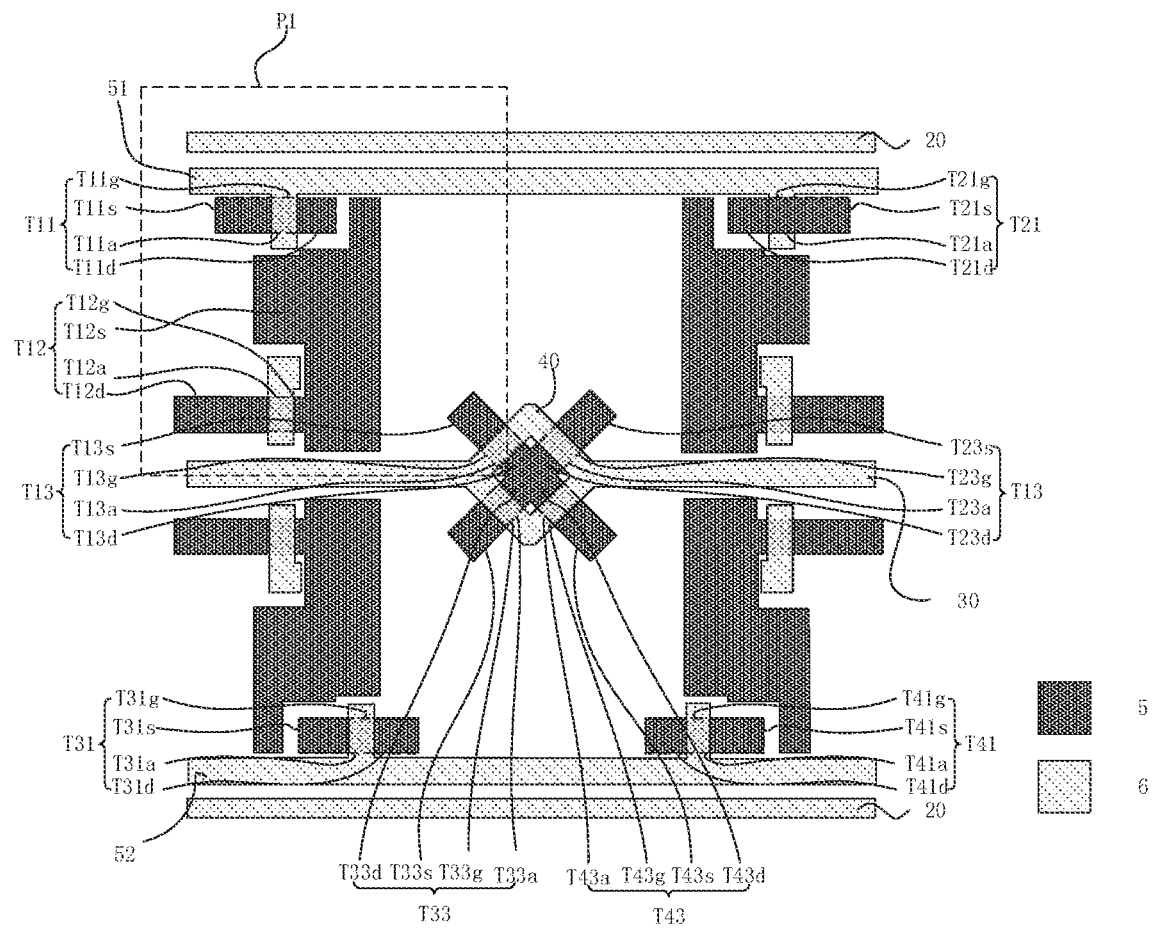
FIG. 13A is a top view of a fifth pattern layer stacked with a sixth pattern layer in a light-emitting substrate, in accordance with some embodiments.

FIG. 13A is a top view of the fifth pattern layer stacked with the sixth pattern layer. Referring to FIGS. 10 and 13A, the sub-pixel unit P1 is taken as an example (structures of the sub-pixel unit P2, the sub-pixel unit P3, and the sub-pixel unit P4 being similar to that of the sub-pixel unit P1, which will not be repeated here), the first transistor T11 includes an active layer T11a, a first conductive portion T11d, a second conductive portion T11s, and a gate T11g. The first transistor T12 includes an active layer T12a, a first conductive portion T12d, a second conductive portion T12s, and a gate T12g. The second transistor T13 includes an active layer T13a, a first conductive portion T13d, a second conductive portion T13s, and a gate T13g. The active layer T11a, the first conductive portion T11d, the second conductive portion T11s, the active layer T12a, the first conductive portion T12d, the second conductive portion T12s, the active layer T13a, the first conductive portion T13d, and the second conductive portion T13s are disposed in the fifth pattern layer 5. The gate T11g, the gate T12g, and the gate T13g are disposed in the sixth pattern layer 6.

In some embodiments, the first transistor includes a driving transistor. For example, referring to FIG. 10, the sub-pixel unit P1 is taken as an example, the pixel driving circuit in the sub-pixel unit P1 may have a 2T1C structure, and include two transistors (the transistor T11 and the transistor T12), and a capacitor C1. Two electrode plates of the capacitor C1 may be represented by C1b in FIG. 12C and T12s in FIG. 13A. The electrode plate C1b of the capacitor C1 may be coupled to the light-emitting device 200a through a transfer pattern 90a. In the first transistor T11 and the first transistor T12, the first transistor T12 may be the driving transistor, and may be coupled to the light-emitting device to control a magnitude of a current transmitting through the light-emitting device.

On this basis, a width-to-length ratio of a channel region of the second transistor (e.g., the second transistor T13) is less than a width-to-length ratio of a channel region of the driving transistor (e.g., the first transistor T12). The channel region may be located between the first conductive portion and the second conductive portion of the transistor. When the transistor is turned on, the channel region may form a conductive channel, for example, the channel region may be the active layer of the transistor. Accordingly, an effective length of the channel region may be a length from a border of the active layer connected to the first conductive portion to a border of the active layer connected to the second conductive portion in the active layer. Since the width-to-length ratio of the channel region of the second transistor (e.g., the second transistor T13) is less than the width-to-length ratio of the channel region of the driving transistor (e.g., the first transistor T12), the second transistor may have a small threshold voltage, which may improve the accuracy of each light-detecting device 500.

In some embodiments, a length direction of the channel region of the second transistor (e.g., the second transistor T13) is non-parallel to a length direction of a channel region of each first transistor (e.g., the first transistor T11 or the first transistor T12). The length direction of the channel region may be parallel to a direction of the effective length of the channel region. The direction of the effective length of the channel region may be an extension direction from the border of the active layer connected to the first conductive portion to the border of the active layer connected to the second conductive portion. Since the length direction of the channel region of the second transistor (e.g., the second transistor T13) is non-parallel to the length direction of the channel region of each first transistor (e.g., the first transistor T11 or the first transistor T12), the light-emitting substrate may have a greatly irregular structure. In this way, a diffraction effect of light in the light-emitting substrate may be reduced, thereby reducing an effect of the diffraction of light in the light-emitting substrate on the display effect of the light-emitting substrate.

In some embodiments, the active layers of the transistors may be located on a side of the light-detecting device proximate to the base substrate. For example, in the thickness direction of the light-emitting substrate, the active layers may be located between the light-detecting device and the base substrate. For example, referring to FIGS. 12A and 12D, the fifth pattern layer 5 includes the active layers of the transistors (e.g., the active layer T11*a* of the first transistor T11, the active layer T12*a* of the first transistor T12, and the active layer T13*a* of the second transistor T13); the seventh pattern layer 7 includes semiconductor patterns 520 of light-detecting devices (e.g., including a semiconductor pattern 520*a* of the light-detecting device 500*a*, a semiconductor pattern 520*b* of a light-detecting device 500*b*, a semiconductor pattern 520*c* of a light-detecting device 500*c*, and a semiconductor pattern 520*d* of a light-detecting device 500*d*). The fifth pattern layer 5 may be located between the seventh pattern layer 7 and the base substrate.

Figure 13B:
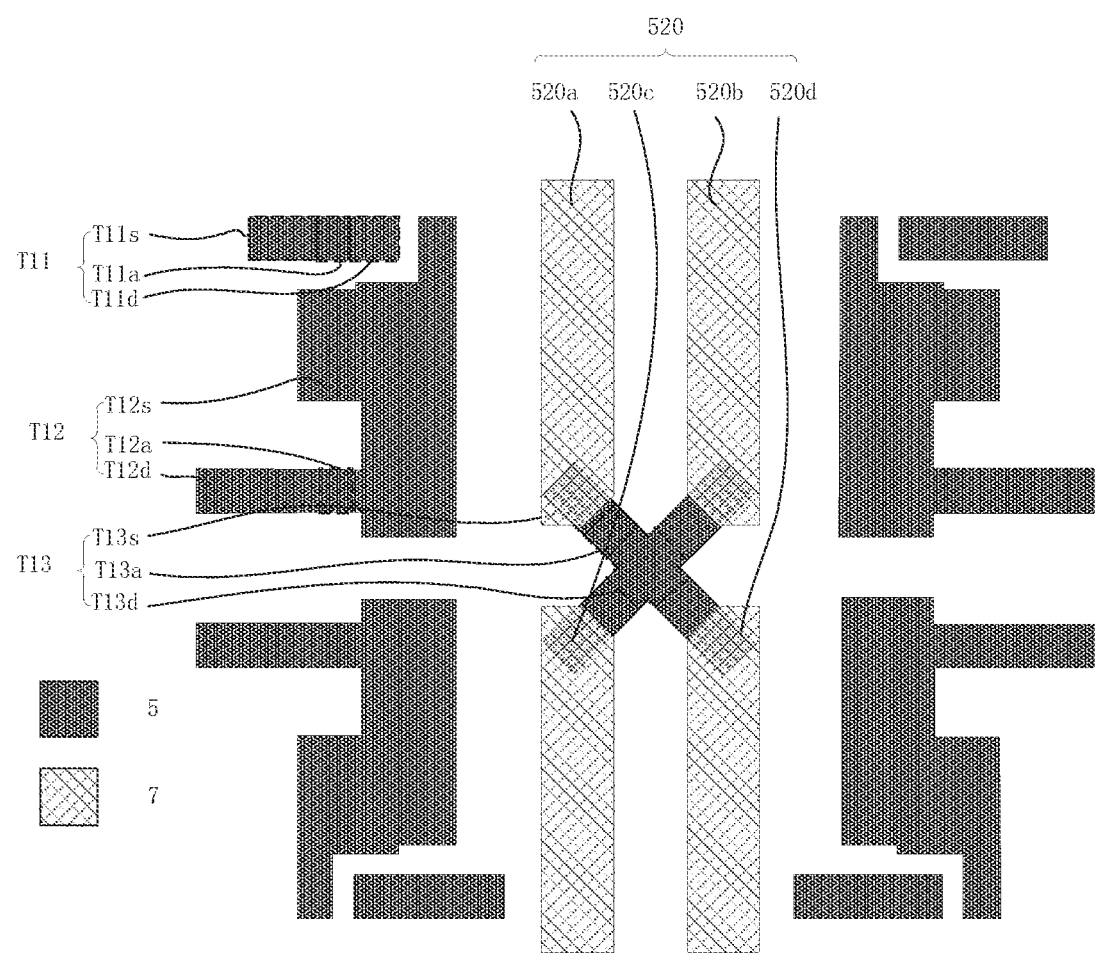
FIG. 13B is a top view of a fifth pattern layer stacked with a seventh pattern layer in a light-emitting substrate, in accordance with some embodiments.

On this basis, FIG. 13B is a top view of the fifth pattern layer stacked with the seventh pattern layer. Referring to FIG. 13B, the orthogonal projections of the semiconductor patterns 520 of the light-detecting devices on the base substrate are non-overlap with an orthogonal projection of an active layer in each transistor (e.g., the active layer T11*a* of the first transistor T11, the active layer T12*a* of the first transistor T12, and the active layer T13*a* of the second transistor T13) on the base substrate. In this way, it is possible to make the light-detecting device to be flat, and it is beneficial to improve the light-detecting performance of the light-detecting device. In addition, a material of the semiconductor pattern 520 of the light-detecting device may include a material containing hydrogen (H). However, it may be possible to make the active layer conductive after H entering the active layer of the transistor, thereby affecting the performance of the transistor. Since the orthogonal projection of the semiconductor pattern of the light-detecting device on the base substrate is non-overlap with the orthogonal projection of the active layer of the transistor on the base substrate, an effect of H in the semiconductor pattern of the light-detecting device on the active layer in the transistor may be reduced.

In some embodiments, an area of the orthogonal projection of the semiconductor pattern 520 of the light-detecting device on the base substrate is greater than an area of the orthogonal projection of the active layer of the second transistor (e.g., the active layer T13*a* of the second transistor T13) on the base substrate. In this way, the area of the semiconductor pattern 520 of the light-detecting device is relatively large, which may make the light-detecting device detect light more accurately.

In some embodiments, the light-emitting substrate may include at least two (e.g., two or n, n being greater than or equal to 3) light-detecting devices and at least two light-emitting devices.

For example, referring to FIG. 10, the light-emitting substrate includes four light-detecting devices (i.e., a light-detecting device 500*a*, a light-detecting device 500*b*, a light-detecting device 500*c*, and a light-detecting device 500*d*) that are respectively included in four sub-pixel units (i.e., the sub-pixel unit P1, the sub-pixel unit P2, the sub-pixel unit P3, and the sub-pixel unit P4) adjacent to one another. The light-emitting substrate further includes four light-emitting devices (i.e., a light-emitting device 200*a*, a light-emitting device 200*b*, a light-emitting device 200*c*, and a light-emitting device 200*d*) that are respectively included in the four sub-pixel units. The four light-emitting devices may emit light of different colors. For example, the light-emitting device 200*a* may emit red light, the light-emitting device 200*b* may emit green light, the light-emitting device 200*c* may emit blue light, and the light-emitting device 200*d* may emit white light.

Referring to FIG. 12C, the fourth pattern layer 4 includes a third electrode 510*a* of the light-detecting device 500*a*, a third electrode 510*b* of the light-detecting device 500*b*, a third electrode 510*c* of the light-detecting device 500*c*, and a third electrode 510*d* of the light-detecting device 500*d*. Referring to 12D, the seventh pattern layer 7 includes the semiconductor pattern 520*a* of the light-detecting device 500*a*, the semiconductor pattern 520*b* of the light-detecting device 500*b*, the semiconductor pattern 520*c* of the light-detecting device 500*c*, and the semiconductor pattern 520*d* of the light-detecting device 500*d*. Referring to FIG. 12E, the eighth pattern layer 8 includes a fourth electrode 530*a* of the light-detecting device 500*a*, a fourth electrode 530*b* of the light-detecting device 500*b*, a fourth electrode 530*c* of the light-detecting device 500*c*, and a fourth electrode 530*d* of the light-detecting device 500*d*. Referring to FIG. 12F, the first pattern layer 1 includes a first sub-electrode 212*a*' of the light-emitting device 200*a*, a first sub-electrode 212*b*' of the light-emitting device 200*b*, a first sub-electrode 212*c* of the light-emitting device 200*c*, and a first sub-electrode 212*d* of the light-emitting device 200*d*. Referring to FIG. 12G, the second pattern layer 2 includes a second sub-electrode 211*a* of the light-emitting device 200*a*, a second sub-electrode 211*b* of the light-emitting device 200*b*, a second sub-electrode 211*c* of the light-emitting device 200*c*, and a second sub-electrode 211*d* of the light-emitting device 200*d*. Referring to FIG. 12H, the third pattern layer 3 includes a third sub-electrode 213*a* of the light-emitting device 200*a*, a third sub-electrode 213*b* of the light-emitting device 200*b*, a third sub-electrode 213*c* of the light-emitting device 200*c*, and a third sub-electrode 213*d* of the light-emitting device 200*d*.

Since a light-emitting device may correspond to a first connection portion, the light-emitting substrate may further include four first connection portions. Referring to FIG. 12F, the first pattern layer 1 further includes first connection patterns 410 of the first connection portions, for example, a first connection pattern 410*a* of a first connection portion corresponding to the light-emitting device 200*a*, a first connection pattern 410*b* of a first connection portion corresponding to the light-emitting device 200*b*, a first connection pattern 410*c* of a first connection portion corresponding to the light-emitting device 200*c*, and a first connection pattern 410*d* of a first connection portion corresponding to the light-emitting device 200*d*. Referring to FIG. 12G, the second pattern layer 2 further includes second connection patterns 420 of the first connection portions, for example, a second connection pattern 420*a* of the first connection portion corresponding to the light-emitting device 200*a*, a second connection pattern 420*b* of the first connection portion corresponding to the light-emitting device 200*b*, a second connection pattern 420*c* of the first connection portion corresponding to the light-emitting device 200*c*, and a second connection pattern 420*d* of the first connection portion corresponding to the light-emitting device 200*d*. Referring to FIG. 12H, the third pattern layer 3 further includes third connection patterns 430 of the first connection portions, for example, a third connection pattern 430*a* of the first connection portion corresponding to the light-emitting device 200*a*, a third connection pattern 430*b* of the first connection portion corresponding to the light-emitting device 200*b*, a third connection pattern 430*c* of the first connection portion corresponding to the light-emitting device 200*c*, and a third connection pattern 430*d* of the first connection portion corresponding to the light-emitting device 200*d*.

Each light-detecting device may be configured to detect a light-emitting condition of a light-emitting device. For example, the light-detecting device 500*a* may be configured to detect a light-emitting condition of the light-emitting device 200*a*, the light-detecting device 500*b* may be configured to detect a light-emitting condition of the light-emitting device 200*b*, the light-detecting device 500*c* may be configured to detect a light-emitting condition of the light-emitting device 200*c*, and the light-detecting device 500*d* may be configured to detect a light-emitting condition of the light-emitting device 200*d*.

The light-emitting substrate may further include at least two second transistors coupled to the at least two light-detecting devices in a one-to-one correspondence. The second transistors are located in a control circuit of the light-detecting devices. A second conductive portion of each second transistor may be coupled to a light-detecting device, so that each second transistor may be configured to control the corresponding light-detecting device to be turned on and off. For example, the second conductive portion T13*s* of the second transistor T13 is coupled to the light-detecting device 500*a*, so that the second transistor T13 may be configured to control the light-detecting device 500*a* to be turned on and off. The second conductive portion T23*s* of the second transistor T23 is coupled to the light-detecting device 500*b*, so that the second transistor T23 may be configured to control the light-detecting device 500*b* to be turned on and off. The second conductive portion T33*s* of the second transistor T33 is coupled to the light-detecting device 500*c*, so that the second transistor T33 may be configured to control the light-detecting device 500*c* to be turned on and off. The second conductive portion T43*s* of the second transistor T43 is coupled to the light-detecting device 500*d*, so that the second transistor T43 may be configured to control the light-detecting device 500*d* to be turned on and off.

Among the second transistors coupled to the light-detecting devices in the one-to-one correspondence, first conductive portions of the second transistors may be an integral pattern. For example, referring to FIGS. 12A and 13A, the first conductive portion T13*d* of the second transistor T13, the first conductive portion T23*d* of the second transistor T23, the first conductive portion T33*d* of the second transistor T33, and the first conductive portion T43*d* of the second transistor T43 may be an integrated pattern. In some possible implementations, referring to FIGS. 10 and 12C, the integral pattern may be coupled to a photoelectric detection signal line 60. In this way, the plurality of transistors may be coupled by using one photoelectric detection signal line 60. Further, the plurality of transistors may be controlled by using one photoelectric detection signal line 60. For example, one photoelectric detection signal line 60 may be used to output the detection signals of the light-detecting device 500*a*, the light-detecting device 500*b*, the light-detecting device 500*c*, and the light-detecting device 500*d*.

In some embodiments, the at least two second transistors include four second transistors coupled to four light-detecting devices in the one-to-one correspondence. For the four second transistors, for example, referring to FIG. 12A, for the second transistor T13, the second transistor T23, the second transistor T33 and the second transistor T43, the first conductive portions thereof (including the first conductive portion T13*d*, the first conductive portion T23*d*, the first conductive portion T33*d*, and the first conductive portion T43*d*, which may be the integral pattern), the active layers thereof (including the active layer T13*a*, the active layer T23*a*, the active layer T33*a* and the active layer T43*a*), and the second conductive portions thereof (including the second conductive portion T13*s*, the second conductive portion T23*s*, the second conductive portion T33*s*, and the second conductive portion T43*s*) provide a cross pattern.

Referring to FIG. 13A, in some embodiments, the light-emitting substrate further includes at least one (e.g., one or more) conductive ring 40, and each conductive ring 40 may be located on a side of the active layers of the transistors away from the base substrate. For example, the conductive ring 40 may be located in the sixth pattern layer 6, and the active layers of the transistors may be disposed in the fifth pattern layer 5. In the thickness direction of the light-emitting substrate, the sixth pattern layer 6 may be located on a side of the fifth pattern layer 5 away from the base substrate.

A conductive ring 40 may correspond to at least two second transistors. For example, the conductive ring 40 corresponds to four second transistors (i.e., the second transistor T13, the second transistor T23, the second transistor T33, and the second transistor T43).

For second transistors corresponding to a same conductive ring, a portion of the conductive ring opposite to the active layer of each second transistor serves as the gate of the second transistor, and an orthogonal projection of the integral pattern formed by the first conductive portions of the second transistors on the base substrate is located inside an orthogonal projection of the conductive ring on the base substrate. For example, a portion of the conductive ring 40 opposite to the active layer T13*a* of the second transistor T13 serves as the gate T13*g* of the second transistor T13, a portion of the conductive ring 40 opposite to the active layer T23*a* of the second transistor T23 serves as a gate T23*g* of the second transistor T23, a portion of the conductive ring 40 opposite to the active layer T33*a* of the second transistor T33 serves as a gate T33*g* of the second transistor T33, and a portion of the conductive ring 40 opposite to the active layer T43*a* of the second transistor T43 serves as a gate T43*g* of the second transistor T43.

In this case, the gates of the second transistors described above may be portions of the same conductive ring, that is, the gates of the second transistors are coupled with one another. In this way, one signal line may be used to control the second transistors to be turned on or off, thereby controlling the light-detecting devices to be turned on or off. For example, the conductive ring 40 includes the gate T13*g* of the second transistor T13, the gate T23*g* of the second transistor T23, the gate T33*g* of the second transistor T33, and the gate T43*g* of the second transistor T43. The above four gates are portions of the same conductive ring 40, so that the four gates are coupled with one another. Further, a photoelectric detection control line 30 may be connected to the conductive ring 40. In this way, the photoelectric detection control line 30 may be used to control the four second transistors to be turned on or off, thereby controlling the four light-detecting devices to be turned on or off.

In some embodiments, the light-emitting substrate further includes a photoelectric detection control line 30, referring to FIG. 12B, for a conductive ring 40, the photoelectric detection control line 30 includes two control line segments (i.e., a control line segment 30*a* and a control line segment 30*b*) coupled to the conductive ring 40. Each control line segment and the conductive ring 40 provide an obtuse angle at a position where the control line segment coupled to the conductive ring 40. For example, the conductive ring 40 is in a shape of a rhombus, and the control line segment 30a and the conductive ring 40 provide an obtuse angle α1 at a position where the control line segment 30a coupled to the conductive ring 40, and the control line segment 30b and the conductive ring 40 provide an obtuse angle α2 at a position where the control line segment 30b coupled to the conductive ring 40. In this way, an electrostatic effect between the control line segments (e.g., the control line segment 30a and the control line segment 30b) and the conductive ring 40 may be reduced, and the yield of the light-emitting substrate may be improved.

Referring to FIG. 12B, the sixth pattern layer 6 includes the conductive ring 40, the auxiliary electrode lines 20, the photoelectric detection control line 30, and the gates of the transistors (e.g., gate T11g, gate T12g, and gate T13g). Therefore, the conductive ring 40, the auxiliary electrode lines 20, the photoelectric detection control line 30, and the gates of the transistors may be disposed in a same layer.

The light-emitting substrate provided by the embodiments of the present disclosure may further include other signal lines.

In some embodiments, referring to FIGS. 13A and 12B, the light-emitting substrate further includes gate lines (e.g., a gate line 51 and a gate line 52). The gate lines may be disposed above the base substrate. For example, the gate lines may be disposed in the sixth pattern layer 6, and are disposed in the same layer as the auxiliary electrode lines 20, the conductive ring 40, the photoelectric detection control line 30, and the gates of the transistors. A gate line may be configured to control light-emitting devices to be turned on and off. For example, the gate line 51 may be configured to control the light-emitting device 200a and the light-emitting device 200b to be turned on and off, and the gate line 52 may be configured to control the light-emitting device 200c and the light-emitting device 200d to be turned on and off.

In some embodiments, referring to FIGS. 10 and 12C, the light-emitting substrate further includes data lines (e.g., a data line Data1, a data line Data2, a data line Data3, and a data line Data4). The data lines may be disposed above the base substrate. A data line may be configured to provide a data signal to a light-emitting device. For example, the data line Data1, the data line Data2, the data line Data3, and the data line Data4 may be disposed in the fourth pattern layer 4, and the fourth pattern layer 4 further includes the third electrodes 510 of the light-detecting devices (e.g., the third electrode 510a of the light-detecting device 500a, the third electrode 510b of the light-detecting device 500b, the third electrode 510c of the light-detecting device 500c, and the third electrode 510d of the light-detecting device 500d), and the second connection portions 10. That is, the third electrodes 510 of the light-detecting devices and the second connection portion 10 may be disposed in the same layer. Moreover, data lines, the third electrodes 510 of the light-detecting devices and the second connection portion 10 may be disposed in the same layer. The data line Data1 may be configured to provide a data signal to the light-emitting device 200a, the data line Data2 may be configured to provide a data signal to the light-emitting device 200b, the data line Data3 may be configured to provide a data signal to the light-emitting device 200c, and the data line Data4 may be configured to provide a data signal to the light-emitting device 200d.

In some embodiments, the light-emitting substrate further includes power lines. The power lines may be disposed above the base substrate, for example, may be disposed in the fourth pattern layer 4. A power line may be configured to provide a constant voltage signal ELVDD to pixel driving circuits. For example, with continued reference to FIGS. 10 and 12C, the fourth pattern layer 4 further includes a power line Vdd1 and a power line Vdd2. That is, the power line Vdd1 and the power line Vdd2 are disposed in a same layer as the data lines, the third electrodes 510 of the light-detecting devices, and the second connection portions 10. The power supply line Vdd1 may supply the voltage signal ELVDD to pixel driving circuits coupled to the light-emitting device 200a and the light-emitting device 200c, and the power supply line Vdd2 may supply the voltage signal ELVDD to pixel driving circuits coupled to the light-emitting device 200b and the light-emitting device 200d.

Figure 14:
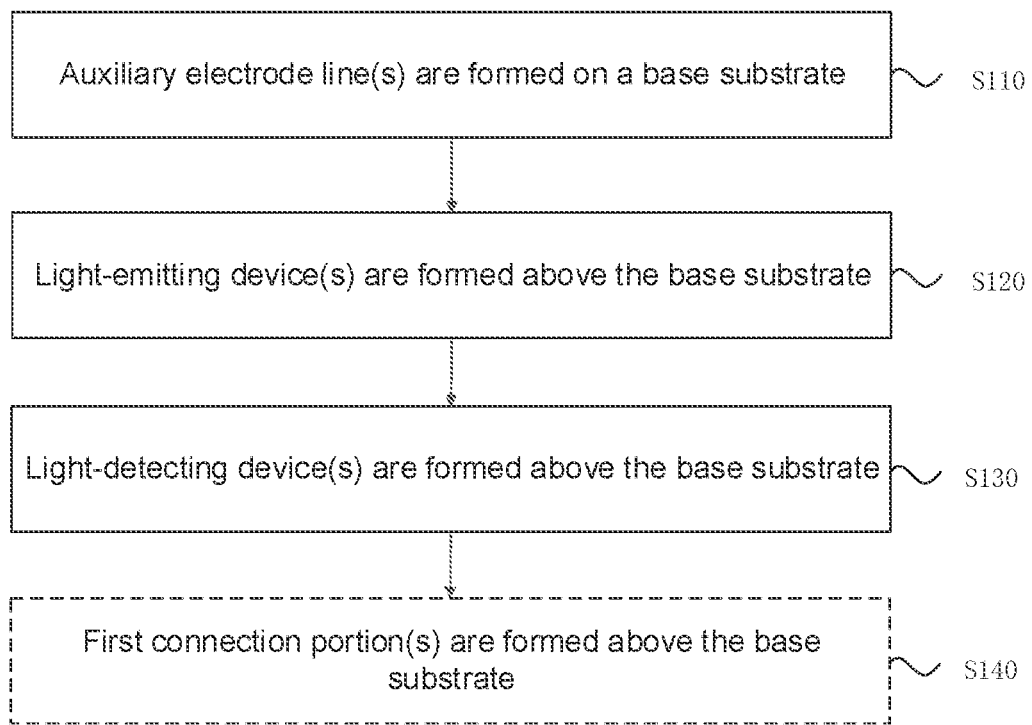
FIG. 14 is a flow diagram of a method for manufacturing a light-emitting substrate, in accordance with some embodiments.

Some embodiments of the present disclosure provide a method for manufacturing a light-emitting substrate. The light-emitting substrate described in any one of the above embodiments may be manufactured by using the manufacturing method. FIG. 14 is a flow diagram of a method for manufacturing a light-emitting substrate. Referring to FIG. 14, the method for manufacturing a light-emitting substrate may include the following steps.

In S110, auxiliary electrode line(s) are formed on a base substrate.

In S120, light-emitting device(s) are formed above the base substrate.

The light-emitting device may include a first electrode, a light-emitting functional layer and a second electrode that are sequentially stacked in a direction moving away from the base substrate.

In S130, light-detecting device(s) are formed above the base substrate.

The light-detecting device includes a third electrode and a fourth electrode. The auxiliary electrode line is coupled to the fourth electrode of the light-detecting device, and the auxiliary electrode line is coupled to the second electrode of the light-emitting device.

In S140 (optionally), first connection portion(s) are formed above the base substrate.

Fourth electrode(s) of the light-detecting device(s) are disposed on a side of second electrode(s) of the light-emitting device(s) proximate to the base substrate, and the auxiliary electrode line(s) are disposed on a side of the fourth electrode(s) of the light-detecting device(s) proximate to the base substrate. Moreover, the first connection portion(s) are disposed on a side of the auxiliary electrode line(s) away from the base substrate, and a side of the second electrode(s) of the light-emitting device(s) proximate to the base substrate. The first connection portion is coupled to the second electrode, the fourth electrode, and the auxiliary electrode line.

In some embodiments, S140 may include the following steps.

In S141, a first pattern layer is formed on the base substrate. The first pattern layer includes first connection pattern(s).

In S142, a conductive film covering the first pattern layer is formed on the base substrate on which the first pattern layer is formed.

In S143, a second pattern layer is formed on the base substrate on which the conductive film is formed. The second pattern layer includes third connection pattern(s).

In S144, the conductive film is etched by using the second pattern layer as a mask, so as to pattern the conductive film to form a third pattern layer. The third pattern layer includes second connection pattern(s), and an orthogonal projection of a second connection pattern on the base substrate is within an orthogonal projection of a corresponding third connection pattern on the base substrate.

After steps S141, S142, S143 and S144, a first connection pattern, a second connection pattern and a third connection pattern that are sequentially stacked are obtained, so as to form a first connection portion.

In some embodiments, the method for manufacturing the light-emitting substrate may include a step of manufacturing the second connection portion(s) as described in the above embodiments, and steps of manufacturing the light-detecting device(s) and/or the transistor(s) as described in the above embodiments. Accordingly, referring to FIGS. 15A to 15J, the method for manufacturing the light-emitting substrate may include following steps.

Figure 15A:
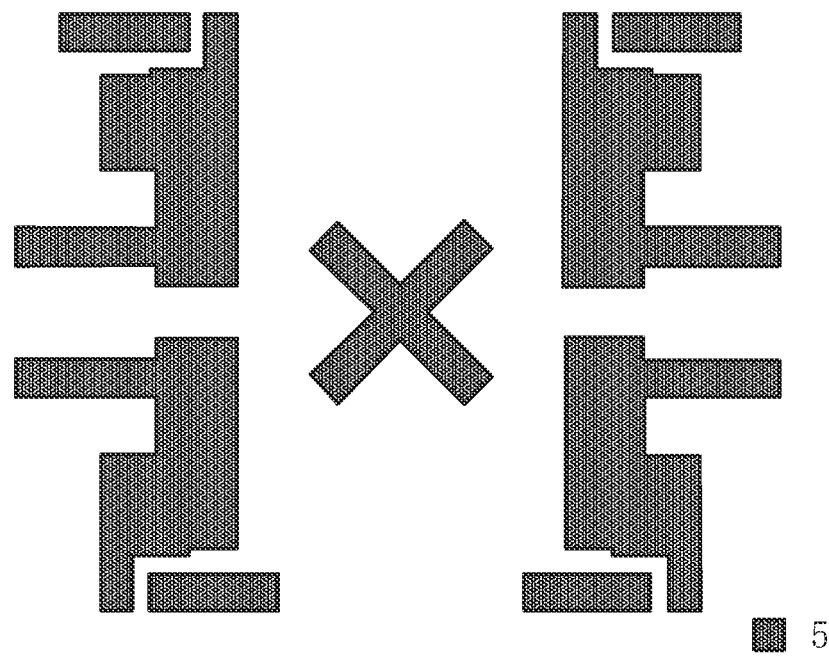
FIGS. 15A to 15J are process flow diagrams of a method for manufacturing a light-emitting substrate, in accordance with some embodiments.

In S210, referring to FIG. 15A, a fifth pattern layer 5 is formed above the base substrate.

A material of the fifth pattern layer to be formed may be a semiconductor material. Portions of the patterns of the fifth pattern layer to be formed may be caused to be conductive through a doping process, the conductive portions may serve as source regions and drain regions of transistors, and the non-conductive portions may serve as active layers of the transistors, so that the fifth pattern layer 5 is obtained.

Figure 15B:
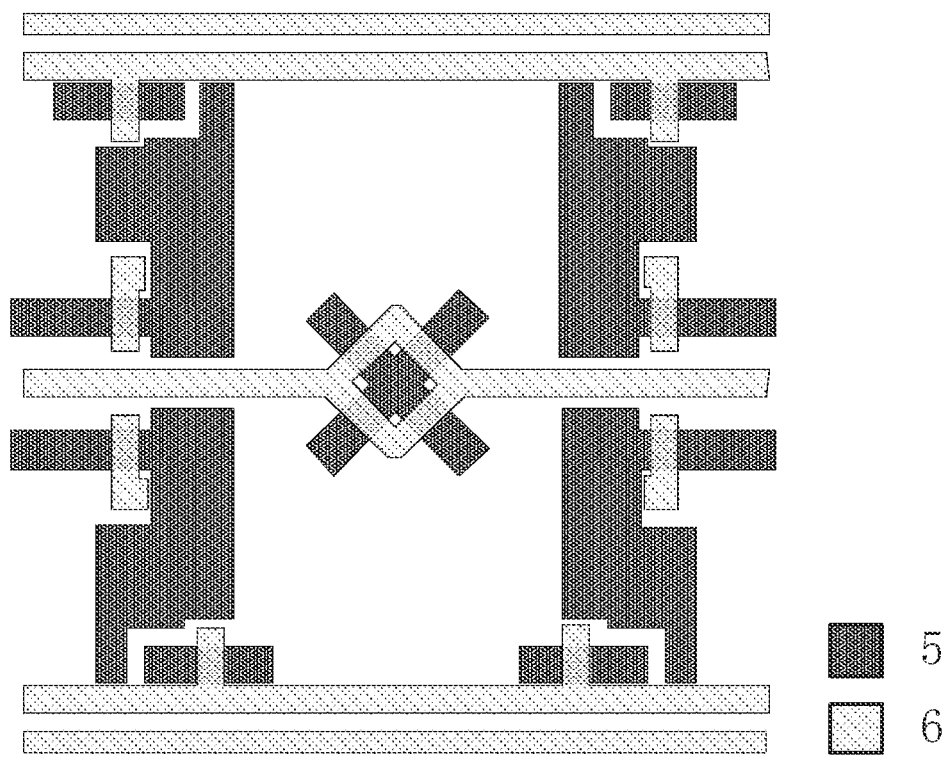

In S220, referring to FIG. 15B, a sixth pattern layer 6 is formed on the base substrate on which the fifth pattern layer 5 is formed.

A material of the sixth pattern layer 6 may be metal.

In some possible implementations, a gate insulating layer may be formed first on the base substrate on which the fifth pattern layer is formed, so that the gate insulating layer covers the source layers of the transistors. Then, the sixth pattern layer is formed on the base substrate on which the gate insulating layer is formed to form the gates of the transistors.

Figure 15C:
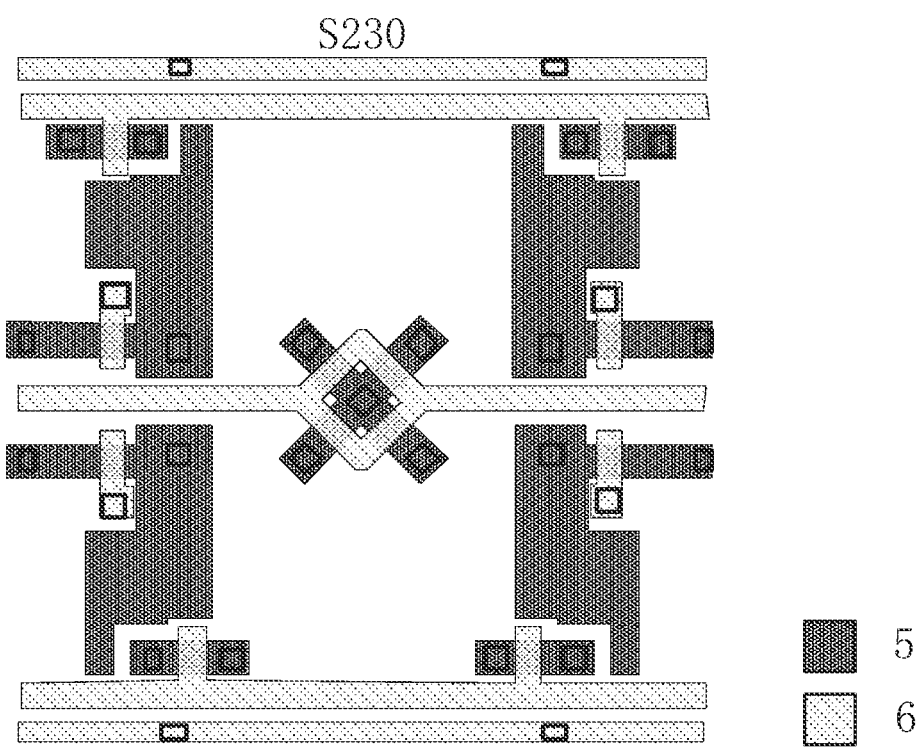

In S230, referring to FIG. 15C, a fourth insulating layer is formed on the base substrate on which the sixth pattern layer 6 is formed.

A material of the fourth insulating layer may be an insulating material, such as silicon dioxide, or silicon nitride. The fourth insulating layer may include seventh openings.

Figure 15D:
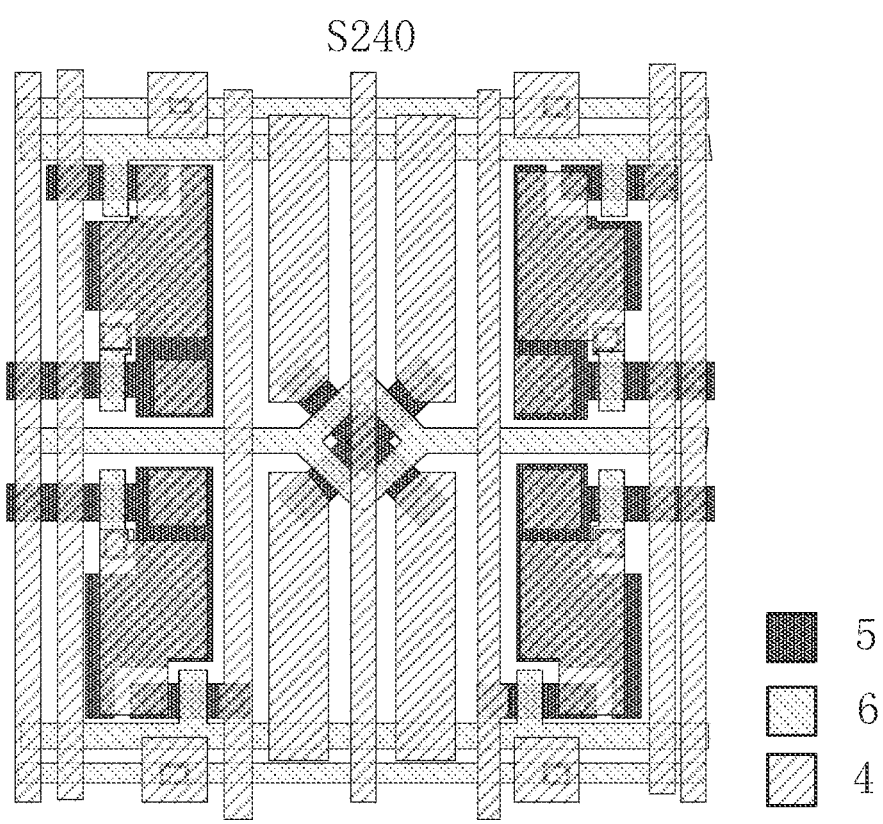

In S240, referring to FIG. 15D, a fourth pattern layer 4 is formed on the base substrate on which the fourth insulating layer is formed. A material of the fourth pattern layer 4 may be metal.

Figure 15E:
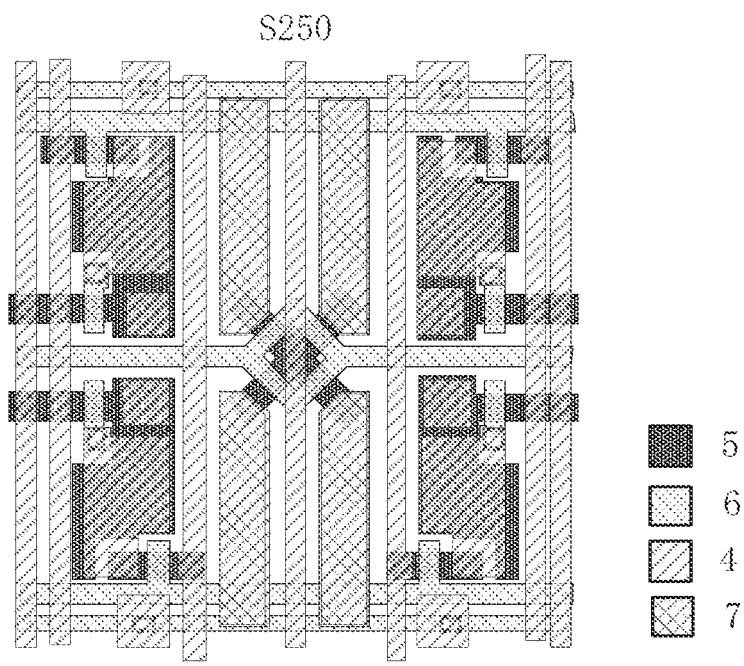

In S250, referring to FIG. 15E, a seventh pattern layer 7 is formed on the base substrate on which the fourth pattern layer 4 is formed. A material of the seventh pattern layer 7 may be a semiconductor material. For example, the material of the seventh pattern layer 7 may include an n-type semiconductor material, an intrinsic semiconductor material, and a p-type semiconductor material. The intrinsic semiconductor material may be lightly doped.

Figure 15F:
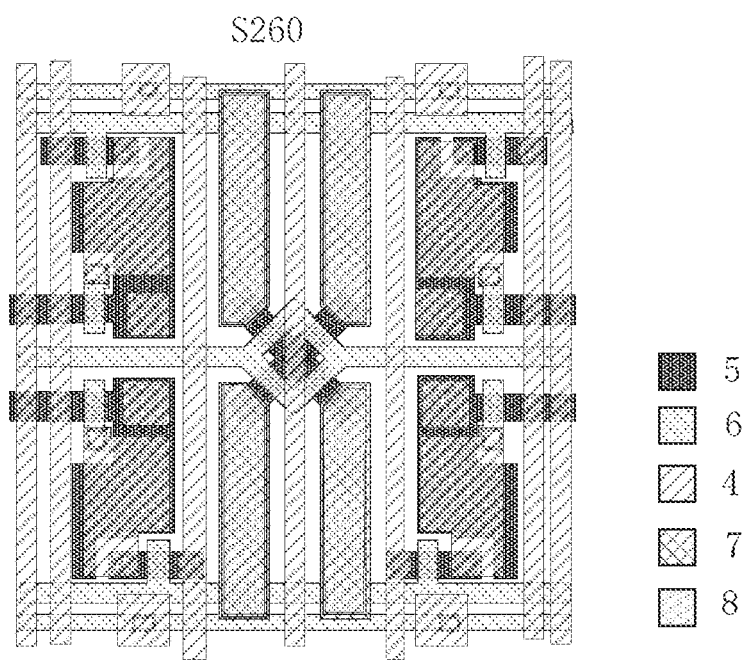

In S260, referring to FIG. 15F, an eighth pattern layer 8 is formed on the base substrate on which the seventh pattern layer 7 is formed. A material of the eighth pattern layer 8 may be a transparent conductive material. For example, the material of the eighth pattern layer 8 may be metal oxide, such as indium tin oxide (ITO), or indium zinc oxide (IZO).

Figure 15G:
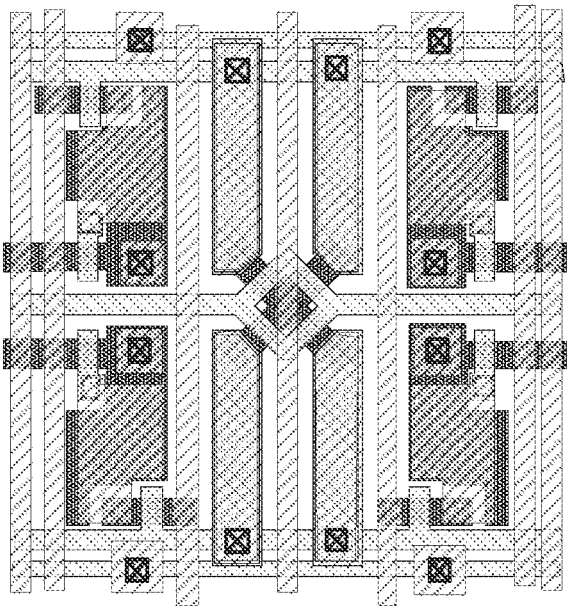

In S270, referring to FIG. 15G, a second insulating layer is formed on the base substrate on which the eighth pattern layer 8 is formed. A material of the second insulating layer may be an insulating material, such as silicon dioxide, or silicon nitride. The second insulating layer may include third openings and/or fifth openings.

Figure 15H:
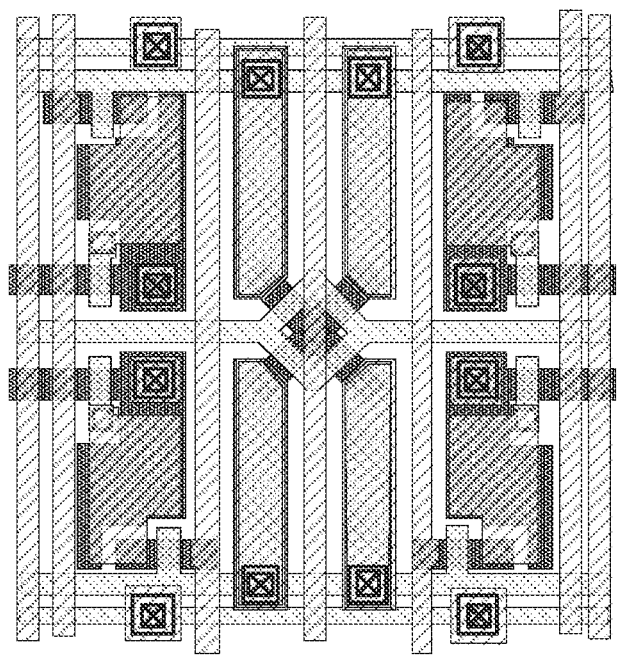

In S280, referring to FIG. 15H, a third insulating layer is formed on the base substrate on which the second insulating layer is formed. A material of the third insulating layer may be an insulating material, such as silicon dioxide, or silicon nitride. The third insulating layer may include fourth openings and/or sixth openings.

Figure 15I:
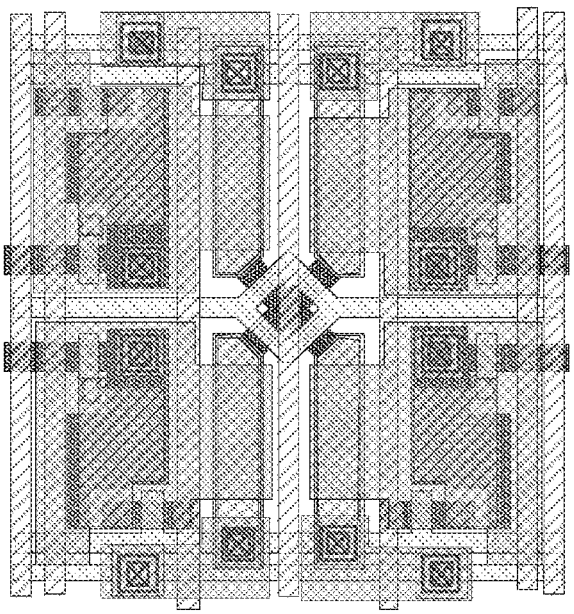

In S290, referring to FIG. 15I, a first pattern layer 1 is formed on the base substrate on which the third insulating layer is formed.

A material of the first pattern layer 1 may be a transparent conductive material. For example, the material of the first pattern layer 1 may be metal oxide, such as indium tin oxide (ITO), or indium zinc oxide (IZO).

Figure 15J:
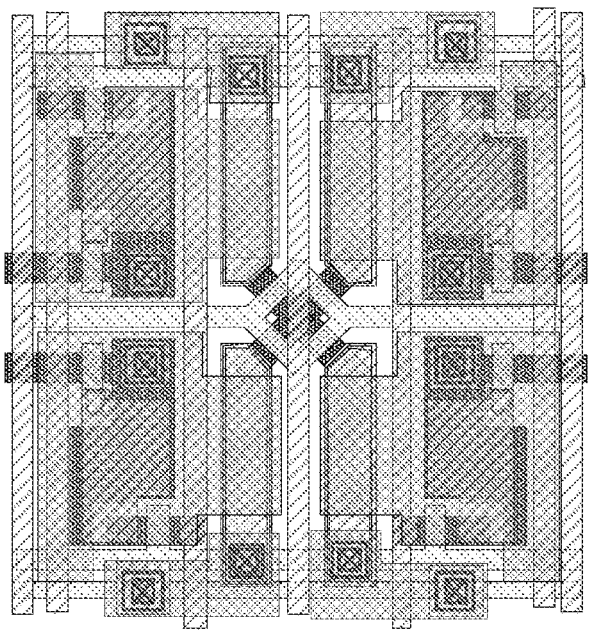

In S300, referring to FIG. 15J, a second pattern layer 2 and a third pattern layer are formed on the base substrate on which the first pattern layer 1 is formed.

In some possible implementations, forming the second pattern layer 2 and the third pattern layer on the base substrate on which the first pattern layer 1 is formed may include: forming a conductive layer on the base substrate on which the first pattern layer 1 is formed, a material of the conductive film being metal, such as Al, and the conductive film covering the first pattern layer 1; forming the third pattern layer on the base substrate on which the conductive film, a material of the third pattern layer being a material with a high work function, for example, metal oxide, such as indium tin oxide (ITO), or indium zinc oxide (IZO); then, etching the conductive film by using the third pattern layer as a mask, so as to pattern the conductive film as the second pattern layer 2. A shape of the third pattern layer 3 may be similar to a shape of the second pattern layer 2 through this process. FIG. 21J only shows the second pattern layer 2, and omits the third pattern layer.

In S320 (optionally), one or more of the first insulating layer, the light-emitting functional layer(s) and the second electrode(s) are formed on the base substrate on which the third pattern layer 3 are formed.

A material of the first insulating layer may be an insulating material, such as silicon dioxide, or silicon nitride. The first insulating layer may include first openings, and the first insulating layer may further include second openings and/or eighth openings.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the scope of the present disclosure shall be subject to the protection scope of the claims.

What is claimed is:
1. A light-emitting substrate, comprising:
a base substrate;
an auxiliary electrode line disposed on the base substrate;
at least one light-emitting device disposed above the base substrate, a light-emitting device including a first electrode, a light-emitting functional layer and a second electrode that are sequentially stacked in a direction moving away from the base substrate; and
at least one light-detecting device disposed above the base substrate, a light-detecting device including a third electrode and a fourth electrode; wherein
the fourth electrode of the light-detecting device is disposed on a side of the second electrode of the light-emitting device proximate to the base substrate, and the auxiliary electrode line is disposed on a side of the fourth electrode of the light-detecting device proximate to the base substrate; and the auxiliary electrode line is coupled to the fourth electrode and the second electrode.

2. The light-emitting substrate according to claim 1, further comprising a first connection portion, wherein the first connection portion is disposed on a side of the auxiliary electrode line away from the base substrate and a side of the second electrode proximate to the base substrate, and the first connection portion is coupled to the second electrode, the fourth electrode, and the auxiliary electrode line.

3. The light-emitting substrate according to claim 2, further comprising a first insulating layer disposed on a side of the first connection portion away from the base substrate and a side of the second electrode of the light-emitting device proximate to the base substrate; wherein the first insulating layer includes a first opening, and the first opening exposes at least a portion of the first connection portion; the second electrode of the light-emitting device extends into the first opening, and is in contact with the first connection portion in the first opening.

4. The light-emitting substrate according to claim 3, wherein the first connection portion includes a first connection pattern, a second connection pattern and a third connection pattern that are sequentially stacked in the direction moving away from the base substrate, an orthogonal projection of the second connection pattern on the base substrate is within an orthogonal projection of the third connection pattern on the base substrate; and the first opening of the first insulating layer exposes at least a portion of the first connection pattern, at least a portion of the second connection pattern and at least a portion of the third connection pattern; the light-emitting functional layer of the light-emitting device extends into the first opening, and a portion of the light-emitting functional layer located in the first opening is discontinuous; a portion of the second electrode located in the first opening is in contact with at least one of the first connection pattern, the second connection pattern and the third connection pattern.

5. The light-emitting substrate according to claim 4, wherein the orthogonal projection of the second connection pattern on the base substrate is within an orthogonal projection of the first connection pattern on the base substrate; and the portion of the second electrode located in the first opening is at least in contact with the first connection pattern; and/or the first connection pattern of the first connection portion is in contact with the fourth electrode.

6. The light-emitting substrate according to claim 3, wherein the first insulating layer further includes a second opening, and a portion of the light-emitting functional layer of the light-emitting device located in the second opening is in contact with the first electrode of the light-emitting device.

7. The light-emitting substrate according to claim 2, further comprising a second connection portion disposed on a side of the first connection portion proximate to the base substrate and the side of the auxiliary electrode line away from the base substrate; wherein the second connection portion is in contact with the first connection portion and the auxiliary electrode line.

8. The light-emitting substrate according to claim 7, wherein the second connection portion and the third electrode of the light-detecting device are disposed in a same layer; and/or the light-emitting substrate further comprising a second insulating layer and a third insulating layer that are sequentially stacked above the base substrate in the direction moving away from the base substrate, and located on the side of the first connection portion proximate to the base substrate and a side of the second connection portion away from the base substrate; wherein the second insulating layer has a third opening, the third insulating layer has a fourth opening; an orthogonal projection of an upper edge of the third opening on the base substrate is within an orthogonal projection of a lower edge of the fourth opening on the base substrate, and overlaps with an orthogonal projection of the second connection portion on the base substrate; the first connection portion is in contact with the second connection portion through the third opening and the fourth opening; and the upper edge of the third opening is an edge of the third opening away from the base substrate, and the lower edge of the fourth opening is an edge of the fourth opening proximate to the base substrate.

9. The light-emitting substrate according to claim 2, further comprising a second insulating layer and a third insulating layer that are sequentially stacked above the base substrate in the direction moving away from the base substrate, and located on a side of the first connection portion proximate to the base substrate and a side of the fourth electrode away from the base substrate; wherein the second insulating layer has a fifth opening, the third insulating layer has a sixth opening; an orthogonal projection of an upper edge of the fifth opening on the base substrate is within an orthogonal projection of a lower edge of the sixth opening on the base substrate, and overlaps with an orthogonal projection of the fourth electrode on the base substrate; the first connection portion is in contact with the fourth electrode through the fifth opening and the sixth opening; and the upper edge of the fifth opening is an edge of the fifth opening away from the base substrate, and the lower edge of the sixth opening is an edge of the sixth opening proximate to the base substrate.

10. The light-emitting substrate according claim 1, further comprising:

a plurality of transistors including at least one first transistor coupled to the light-emitting device, and a second transistor coupled to the light-detecting device; wherein the plurality of transistors are disposed on the base substrate, each transistor includes an active layer located on a side of the light-detecting device proximate to the base substrate; and the light-detecting device further includes a semiconductor pattern, an orthogonal projection of the semiconductor pattern on the base substrate is non-overlap with an orthogonal projection of each active layer of the plurality of transistors on the base substrate.

11. The light-emitting substrate according to claim 10, wherein an area of the orthogonal projection of the semiconductor pattern of the light-detecting device on the base substrate is larger than an area of an orthogonal projection of an active layer of the second transistor on the base substrate; and/or the at least one first transistor includes a driving transistor, a width-to-length ratio of a channel region of the second transistor is less than a width-to-length ratio of a channel region of the driving transistor.

12. The light-emitting substrate according to claim 10, wherein the light-emitting substrate comprises at least two light-detecting devices and at least two second transistors coupled to the at least two light-detecting devices in a one-to-one correspondence; and each second transistor in the at least two second transistors further includes a first conductive portion and a second conductive portion that are respectively located on two sides of the active layer and in contact with the active layer, first conductive portions of the at least two second transistors are an integral pattern, and each second conductive portion is coupled to a light-detecting device of the at least two light-detecting devices.

13. The light-emitting substrate according to claim 12, wherein the at least two second transistors include four second transistors, the at least two light-detecting devices includes four light-detecting devices; and first conductive portions, active layers and second conductive portions of the four second transistors provide a cross pattern; and/or the light-emitting substrate further comprises a photoelectric detection signal line coupled to the integral pattern.

14. The light-emitting substrate according to claim 12, further comprising:

at least one conductive ring, each conductive ring being located on a side of the active layer away from the base substrate, wherein a portion of a conductive ring opposite to the active layer of each second transistor of the at least two second transistors serves as a gate of the second transistor; and an orthogonal projection of the integral pattern on the base substrate is located inside an orthogonal projection of the conductive ring on the base substrate; or the light-emitting substrate further comprising:

at least one conductive ring, each conductive ring being located on a side of the active layer away from the base substrate, wherein a portion of a conductive ring opposite to the active layer of each second transistor of the at least two second transistors serves as a gate of the second transistor; and an orthogonal projection of the integral pattern on the base substrate is located inside an orthogonal projection of the conductive ring on the base substrate; and a photoelectric detection control line including two control line segments coupled to the conductive ring, each control line segment and the conductive ring providing an obtuse angle at a position where the control line segment coupled to the conductive ring.

15. The light-emitting substrate according to claim 1, further comprising:

data lines disposed above the base substrate; the data lines and the third electrode being disposed in a same layer; and/or gate lines disposed above the base substrate, the gate lines and the auxiliary electrode line being disposed in a same layer.

16. The light-emitting substrate according to claim 1, wherein the first electrode of the light-emitting device includes a first sub-electrode, a second sub-electrode and a third sub-electrode that are sequentially stacked in the direction moving away from the base substrate; wherein the first sub-electrode is a transparent conductive electrode, the second sub-electrode is a reflective electrode, the first sub-electrode includes a first portion and a second portion except for the first portion, the first portion is covered by the third electrode, an orthogonal projection of the second portion on the base substrate overlaps with an orthogonal projection of the light-detecting device on the base substrate.

17. The light-emitting substrate according to claim 16, further comprising:

a first connection portion disposed on a side of the auxiliary electrode line away from the base substrate and a side of the second electrode proximate to the base substrate, the first connection portion being coupled to the second electrode, the fourth electrode, and the auxiliary electrode line, and including a first connection pattern, a second connection pattern, and a third connection pattern that are sequentially stacked in a direction moving away from the base substrate; wherein the first sub-electrode and the first connection pattern of the first connection portion are disposed in a same layer;

the second sub-electrode and the second connection pattern of the first connection portion are disposed in a same layer; and the third sub-electrode and the third connection pattern of the first connection portion are disposed in a same layer.

18. The light-emitting substrate according to claim 1, wherein the fourth electrode of the light-detecting device is closer to the light-emitting device than the third electrode; and the fourth electrode is a transparent conductive electrode.

19. The light-emitting substrate according to claim 1, wherein the light-emitting substrate is a display panel.

20. A display apparatus, comprising the light-emitting substrate according to claim 19.

* * * * *